(12) United States Patent
Cho et al.

(10) Patent No.: US 12,039,127 B2
(45) Date of Patent: Jul. 16, 2024

(54) INPUT SENSING PANEL AND DISPLAY DEVICE INCLUDING THE SAME

(71) Applicant: Samsung Display Co., Ltd., Yongin-si (KR)

(72) Inventors: Hyun-Wook Cho, Yongin-si (KR); Youngsik Kim, Yongin-si (KR); Sangkook Kim, Yongin-si (KR); Taejoon Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/132,326

(22) Filed: Apr. 7, 2023

(65) Prior Publication Data
US 2023/0409140 A1 Dec. 21, 2023

(30) Foreign Application Priority Data
Jun. 17, 2022 (KR) .......................... 10-2022-0074416

(51) Int. Cl.
| | | |
|---|---|---|
| *G06F 3/041* | (2006.01) | |
| *G06F 3/042* | (2006.01) | |
| *H10K 59/131* | (2023.01) | |
| *H10K 59/40* | (2023.01) | |
| *H10K 59/88* | (2023.01) | |

(52) U.S. Cl.
CPC ........ *G06F 3/04164* (2019.05); *G06F 3/0412* (2013.01); *G06F 3/0421* (2013.01); *H10K 59/131* (2023.02); *H10K 59/40* (2023.02); *H10K 59/88* (2023.02); *G06F 2203/04102* (2013.01)

(58) Field of Classification Search
None
See application file for complete search history.

(56) References Cited

U.S. PATENT DOCUMENTS

| | | | |
|---|---|---|---|
| 10,802,653 | B2 | 10/2020 | Lee |
| 2015/0378494 | A1* | 12/2015 | Cok ...................... G06F 3/0446 |
| | | | 345/174 |
| 2019/0296099 | A1* | 9/2019 | Lee .................... H10K 59/1315 |
| 2021/0026473 | A1* | 1/2021 | Kim ........................ G06F 3/045 |
| 2022/0147193 | A1 | 5/2022 | Kim et al. |

FOREIGN PATENT DOCUMENTS

| | | | | |
|---|---|---|---|---|
| CN | 102566840 | A * | 7/2012 | ............. G06F 3/044 |
| CN | 104021371 | B * | 4/2018 | |
| CN | 114003146 | A * | 2/2022 | |
| KR | 10-2021-0011781 | A | 2/2021 | |
| KR | 10-2286520 | B1 | 8/2021 | |
| KR | 10-2349591 | B1 | 1/2022 | |

\* cited by examiner

*Primary Examiner* — Duane N Taylor, Jr.
(74) *Attorney, Agent, or Firm* — Lewis Roca Rothgerber Christie LLP

(57) ABSTRACT

A display device, includes: a display panel including an active region and a peripheral region which are adjacent to each other; and an input-sensing panel on the display panel, the input-sensing panel comprising a first region, a second region, and a third region, which are overlapped with the active region and are sequentially arranged, and a fourth region, which is overlapped with the peripheral region, wherein the input-sensing panel comprises: a sensing electrode in the first and second regions and includes a plurality of conductive lines; and a trace line in the third and fourth regions and connected to the sensing electrode, wherein a density per unit area of the conductive lines is higher in the second region than in the first region.

20 Claims, 19 Drawing Sheets

INPUT SENSING PANEL AND DISPLAY DEVICE INCLUDING THE SAME

CROSS-REFERENCE TO RELATED APPLICATION

The present application claims priority to and the benefit of Korean Patent Application No. 10-2022-0074416, filed on Jun. 17, 2022, in the Korean Intellectual Property Office, the entire content of which is hereby incorporated by reference.

BACKGROUND

1. Field

The present disclosure relates to an input-sensing panel and a display device including the same.

2. Description of the Related Art

Multimedia electronic devices, such as television sets, portable phones, tablet computers, computers, navigation systems, and gaming machines, include a device, which is used to display images. The electronic devices include a touch-sensing type input sensor, which allows a user to easily input information or commands in an intuitive and easy manner, in addition to conventional input means, such as buttons, a keyboard, and a mouse.

The input-sensing panel is configured to sense a touch event or pressure input by a user's body. Meanwhile, for a user accustomed to a process of inputting information process using writing instruments or for use in specific application programs (e.g., for sketching or drawing processes), there is an increasing demand for an active pen that can be used to precisely provide input by way of a touch event.

The above information disclosed in this Background section is only for enhancement of understanding of the background and therefore the information discussed in this Background section does not necessarily constitute prior art.

SUMMARY

Aspects of some embodiments of the present disclosure relate to an input-sensing panel and a display device including the same, and for example, an input-sensing panel with a reduced dead space and a display device including the same.

Aspects of some embodiments of the inventive concept include a display device, which has a relatively reduced dead space and has a relatively improved sensing performance to an event input using an active pen.

According to some embodiments of the inventive concept, a display device may include a display panel including an active region and a peripheral region, which are adjacent to each other, and an input-sensing panel on the display panel. According to some embodiments, the input-sensing panel may include a first region, a second region, and a third region, which are overlapped with the active region and are sequentially arranged, and a fourth region, which is overlapped with the peripheral region. According to some embodiments, the input-sensing panel may include a sensing electrode in the first and second regions and includes a plurality of conductive lines, and a trace line in the third and fourth regions and connected to the sensing electrode.

According to some embodiments, a density of the conductive lines per unit area may be higher in the second region than in the first region.

According to some embodiments, the input-sensing panel may further include a dummy electrode in the first, second, and third regions and is electrically disconnected from the sensing electrode and the trace line. The dummy electrode may include a plurality of dummy conductive lines having a shape corresponding to the conductive lines.

According to some embodiments, a density of the dummy conductive lines per unit area may be lower in the second region than in the first region.

According to some embodiments, the density of the dummy conductive lines per unit area may be higher in the third region than in the first region.

According to some embodiments, an area of the second region may be smaller than an area of the first region and may be larger than an area of the third region.

According to some embodiments, the display panel may include a base layer, a circuit device layer including transistors on the base layer, a display device layer on the circuit device layer, an encapsulation substrate spaced apart from the display device layer by a specific distance, and a sealant, which is extended along an edge of the base layer overlapped with the peripheral region and is between the encapsulation substrate and the base layer. According to some embodiments, the display device layer may include emission elements, each of which is connected to a corresponding one of the transistors and includes a first electrode, a second electrode, and an emission layer between the first and second electrodes, and a pixel definition layer, in which display openings overlapped with the first electrodes are defined.

According to some embodiments, the conductive lines may be directly on the encapsulation substrate.

According to some embodiments, the input-sensing panel may include at least one sensing insulating layer covering the conductive lines.

According to some embodiments, the conductive lines may be spaced apart from the display openings and may be overlapped with the pixel definition layer, when viewed in a plan view.

According to some embodiments, the encapsulation substrate may include one of a plastic substrate, a glass substrate, a metal substrate, and a substrate made of an organic/inorganic composite material.

According to some embodiments, the sealant may include one of organic adhesive materials and a frit.

According to some embodiments, the display panel may include a display pad in the peripheral region. According to some embodiments, the input-sensing panel may include a sensing pad in the fourth region and is connected to the trace line. According to some embodiments, the display device may further include a first flexible circuit film connected to the display pad, a second flexible circuit film connected to the sensing pad, and a main circuit board connected to the first and second flexible circuit films.

According to some embodiments of the inventive concept, a display panel may include an active region, in which a plurality of pixels are provided, and a peripheral region, which is adjacent to the active region, and an input-sensing panel including first, second, and third regions overlapped with the active region and a fourth region overlapped with the peripheral region. According to some embodiments, the first region may include a plurality of first unit sensing regions, the second region may include a plurality of second unit sensing regions, and the third region may be spaced apart from the first region with the second region interposed therebetween. According to some embodiments, each of the first and second unit sensing regions may include a first sensing electrode and a second sensing electrode, which are electrically disconnected from each other, and each of which includes a plurality of conductive lines. According to some embodiments, the number of the conductive lines in one of the first unit sensing regions may be smaller than the number of the conductive lines in one of the second unit sensing regions.

According to some embodiments, the input-sensing panel may include trace lines connected to corresponding ones of the first and second sensing electrodes, and sensing pads connected to corresponding ones of the trace lines. According to some embodiments, ones of the trace lines, which are connected to the first sensing electrodes, may be in the third and fourth regions, and ones of the trace lines, which are connected to the second sensing electrodes, may be in only the fourth region.

According to some embodiments, the input-sensing panel may further include a dummy electrode in the first, second, and third regions and is electrically disconnected from the first and second sensing electrodes as well as from the trace line in the third region. According to some embodiments, the dummy electrode may include a plurality of dummy conductive lines having a shape corresponding to the conductive lines.

According to some embodiments, the number of the dummy conductive lines in one of the first unit sensing regions may be greater than the number of the dummy conductive lines in one of the second unit sensing regions.

According to some embodiments, an area of the second region may be smaller than an area of the first region and may be larger than an area of the third region.

According to some embodiments, the first sensing electrodes, which are included in adjacent ones of the first and second unit sensing regions, may be connected to each other in a first direction, and the second sensing electrodes, which are included in adjacent ones of the first and second unit sensing regions, may be connected to each other in a second direction crossing the first direction.

According to some embodiments, the conductive lines may include first conductive lines and second conductive lines. According to some embodiments, each of the first conductive lines may be extended in a first extension direction that is diagonal to the first and second directions, and each of the second conductive lines may be extended in a second extension direction that is diagonal to the first and second directions and is non-parallel to the first extension direction.

According to some embodiments, the active region may include light-emitting regions, to which light rays generated by the pixels are provided, and a non-light-emitting region, which is adjacent to the light-emitting regions. According to some embodiments, the first and second conductive lines may be overlapped with the non-light-emitting region, but not with the light-emitting regions.

DETAILED DESCRIPTION

Figure 1A:
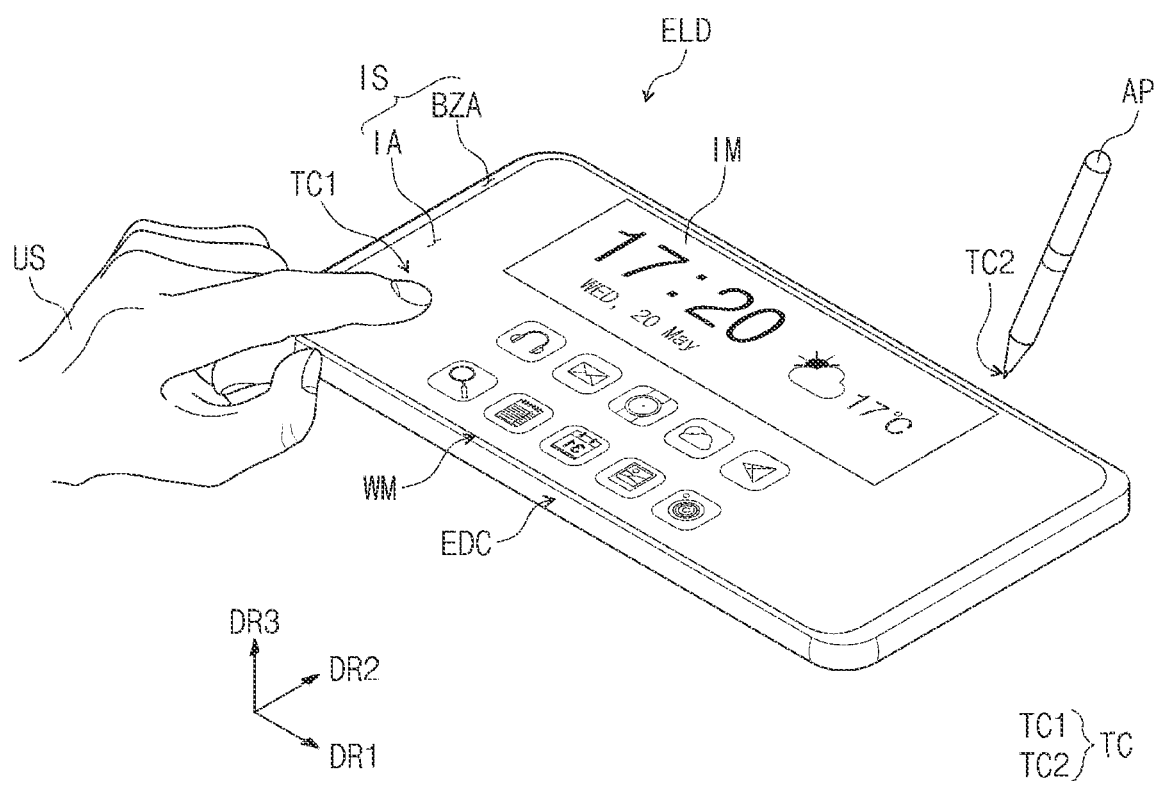
FIG. 1A is a perspective view illustrating an electronic device according to some embodiments of the inventive concept.

Aspects of some example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer, or section. Thus, a first element, component, region, layer, or section discussed below could be termed a second element, component, region, layer, or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Aspects of some example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1B:
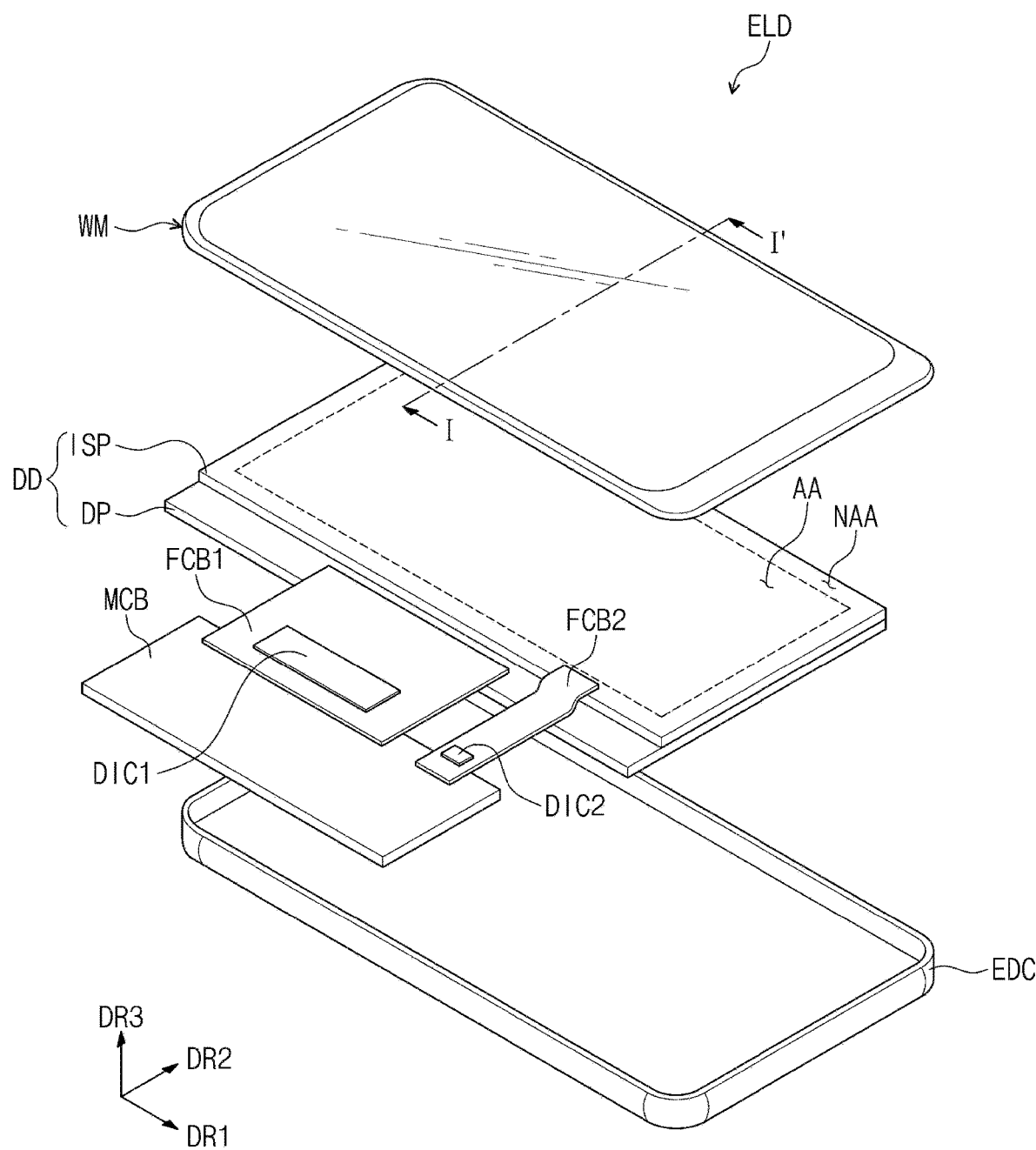
FIG. 1B is an exploded perspective view illustrating an electronic device according to some embodiments of the inventive concept.
Figure 2A:
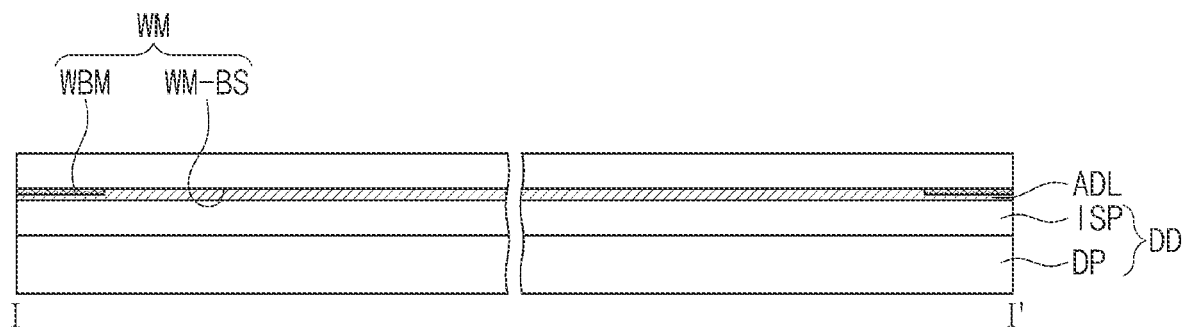
FIGS. 2A and 2B are sectional views taken along a line I-I' of FIG. 1B.
Figure 2B:
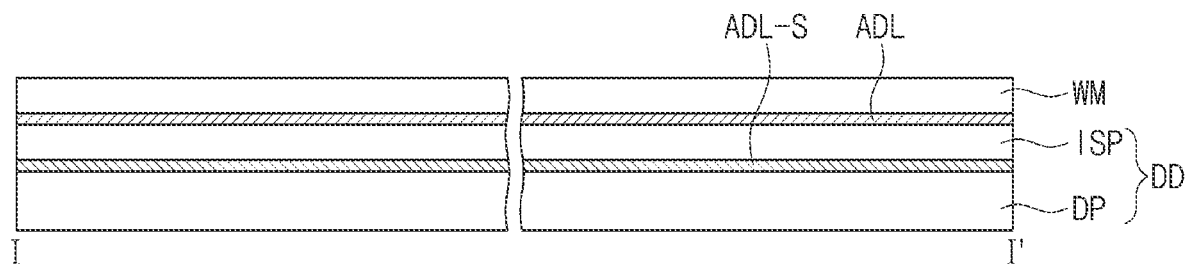
Figure 2C:
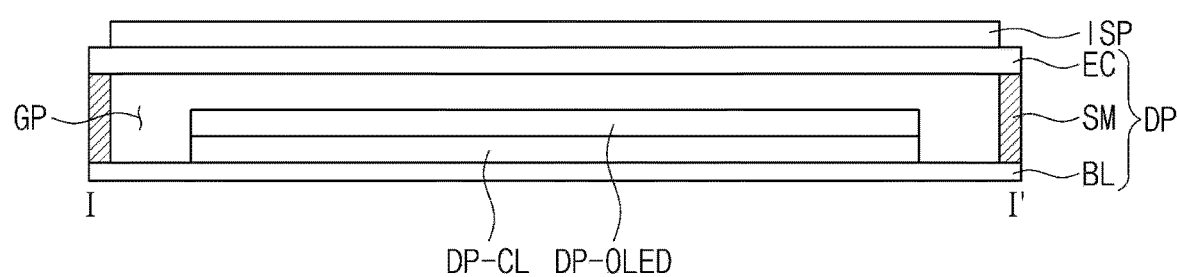
FIGS. 2C and 2D are sectional views taken along the line I-I' of FIG. 1B.
Figure 2D:
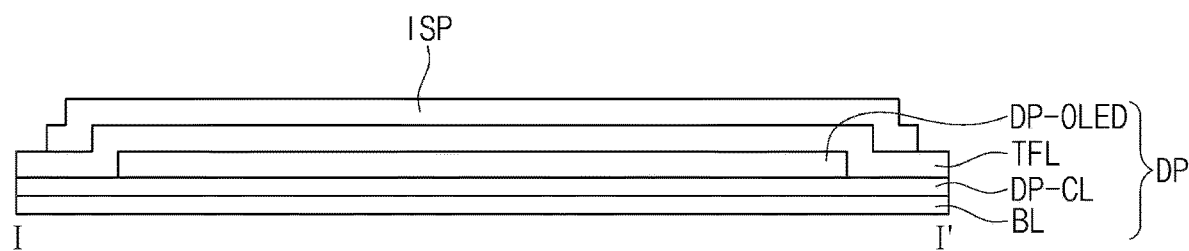

FIG. 1A is a perspective view illustrating an electronic device according to some embodiments of the inventive concept. FIG. 1B is an exploded perspective view illustrating an electronic device according to some embodiments of the inventive concept. FIGS. 2A and 2B are sectional views taken along a line I-I' of FIG. 1B. FIGS. 2C and 2D are sectional views taken along the line I-I' of FIG. 1B.

Referring to FIGS. 1A to 1B, an electronic device ELD may be activated by an electrical signal applied thereto. The electronic device ELD may be realized in various forms. For example, the electronic device ELD may be used for various electronic devices, such as smart phones, tablet computers, laptop computers, computers, and smart television sets.

The electronic device ELD may include a display surface IS, which is parallel to a first direction DR1 and a second direction DR2 and is used to display an image IM in a third direction DR3. The display surface IS displaying the image IM may correspond to a front surface of the electronic device ELD. The image IM may be a video image or a still image.

In the present specification, a front or top surface and a rear or bottom surface of each element or member may be defined based on the third direction DR3 or a display direction of the image IM. The front surface and the rear surface may be opposite to each other in the third direction DR3, and a direction normal to each of the front and rear surfaces may be parallel to the third direction DR3.

A distance between the front and rear surfaces in the third direction DR3 may correspond to a thickness of the electronic device ELD in the third direction DR3. Meanwhile, directions indicated by the first to third directions DR1, DR2, and DR3 may be defined in a manner different from that of FIG. 1A.

The electronic device ELD may sense an external input TC provided from the outside. The external input TC may include various inputs provided from the outside of the electronic device ELD. The electronic device ELD according to some embodiments may sense a first input TC1 input by a user US. The first input TC1 of the user US may be an input produced by a finger and may include any input (e.g., by a user's body) that can cause a change in electrostatic capacitance. The first input TC1 may be an input produced by a passive-type input apparatus. Depending on a structure of the electronic device ELD, the electronic device ELD may be configured to sense the first input TC1, which is applied to a side or rear surface of the electronic device ELD by the user US, but embodiments according to the inventive concept are not limited to this example.

In addition, the electronic device ELD according to some embodiments may be configured to sense a second input TC2, which is of a different type from the first input TC1. The second input TC2 may include an input that is produced by an input apparatus AP (e.g., a stylus pen, an active pen, a touch pen, an electronic pen, or an e-pen). The description that follows will refer to an example, in which the second input TC2 is an input signal produced by the active pen.

The front surface of the electronic device ELD may be sectioned into an image region IA and a bezel region BZA. The image region IA may be a region, at which the image IM is displayed. The user US may recognize the image IM through the image region IA. In the present embodiments, the image region IA is illustrated to have a rectangular shape with rounded vertices. However, embodiments of the inventive concept are not limited to this example, and according to some embodiments, the shape of the image region IA may be variously changed, but embodiments of the inventive concept are not limited to this example.

The bezel region BZA may be adjacent to the image region IA. The bezel region BZA may have a color (e.g., a set or predetermined color). The bezel region BZA may be provided to enclose the image region IA. Accordingly, the shape of the image region IA may be substantially defined by the bezel region BZA. However, embodiments of the inventive concept are not limited to this example, and according to some embodiments, the bezel region BZA may be located adjacent to only one of sides of the image region IA or may be omitted. The electronic device ELD may be realized in various forms, but embodiments according to the inventive concept are not limited to this example.

As shown in FIG. 1B, the electronic device ELD may include a display device DD, a window WM located on the display device DD, and a case EDC. According to some embodiments, the display device DD may include at least a display panel DP and an input-sensing panel ISP.

According to some embodiments, the display panel DP may be a light-emitting type display panel, but embodiments of the inventive concept are not limited to this example. For example, the display panel DP may be an organic light-emitting display panel or a quantum dot light-emitting display panel. An emission layer of the organic light-emitting display panel may be formed of or include an organic light-emitting material. An emission layer of the quantum dot light-emitting display panel may include quantum dots and/or quantum rods. For the sake of simplicity, the description that follows will refer to an example in which the display panel DP is the organic light-emitting display panel.

The input-sensing panel ISP may be located on the display panel DP and may be configured to obtain information on coordinates of an external input (e.g., the first input TC1 and/or the second input TC2). The input-sensing panel ISP will be described in more detail below.

The display device DD may include a main circuit board MCB, a first flexible circuit film FCB1, a first driving chip DIC1, a second flexible circuit film FCB2, and a second driving chip DIC2. According to some embodiments, at least one of them may be omitted from the display device DD. The main circuit board MCB may be coupled to the first flexible circuit film FCB1 and thus may be electrically connected to the display panel DP. The main circuit board MCB may be coupled to the second flexible circuit film FCB2 and may be electrically connected to the input-sensing panel ISP.

The first flexible circuit film FCB1 and the second flexible circuit film FCB2 may be bent such that the main circuit board MCB faces the rear surface of the display device DD. The main circuit board MCB may be electrically connected to another electronic module of the electronic device ELD through a connector.

The first driving chip DIC1 may include a driving device (e.g., a data driving circuit), which is used to drive a pixel in the display panel DP. Embodiments of the inventive concept are not limited to the illustrated example, in which just one first flexible circuit film FCB1 is provided, and according to some embodiments, the electronic device ELD may include a plurality of first flexible circuit films FCB1, which are coupled to the display panel DP.

The first driving chip DIC1 may be provided in the form of a chip-on-film and may be mounted on the first flexible circuit film FCB1. However, embodiments of the inventive concept are not limited to this example. For instance, the first driving chip DIC1 may be directly mounted on the display panel DP. A portion of the display panel DP may be bent, and a portion, on which the first driving chip DIC1 is mounted, may be arranged to face the rear surface of the display device DD.

The second driving chip DIC2 may include circuit devices, which are used to process signals transmitted from the input-sensing panel ISP. The second driving chip DIC2 may be provided in the form of a chip-on-film and may be mounted on the second flexible circuit film FCB2.

The window WM may be formed of a transparent material, allowing an image light to be emitted to the outside. For example, a base layer of the window WM may be formed of or include at least one of glass, sapphire, or plastic materials. The window WM is illustrated to be a single layer, but according to some embodiments, the window member WM may include a plurality of layers.

The case EDC may be combined with the window WM. The case EDC may absorb impact exerted from the outside and may prevent a contamination material or moisture from entering the display device DD, and thus, elements contained in the case EDC may be protected. Meanwhile, according to some embodiments, the case EDC may be provided to include a plurality of containing members coupled to each other.

According to some embodiments, the electronic device ELD may further include an electronic module including various functional modules, which are used to operate the display device DD, a power supply module supplying an electric power, which is required for an overall operation of the electronic device ELD, to the electronic device ELD, and a bracket, which is combined with the display device DD and/or the case EDC and divide an internal space of the electronic device ELD.

The afore-described members may be combined to each other by an adhesive layer ADL (e.g., see FIG. 2A). The adhesive layer ADL may include an optically clear adhesive (OCA) film. However, the adhesive layer ADL is not limited thereto and may include at least one of typical gluing or adhesive agents. For example, the adhesive layer ADL may include an optically clear resin (OCR) film or a pressure-sensitive adhesive (PSA) film.

An anti-reflection layer may be further located between the window WM and the display device DD. The anti-reflection layer may be configured to reduce reflectance of external light, which is incident from the outside through the window WM. According to some embodiments, the anti-reflection layer may include a phase retarder and a polarizer.

The phase retarder may be of a film type or a liquid crystal coating type and may include a A/2 and/or A/4 phase retarder. The polarizer may also be of a film type or a liquid crystal coating type. The polarizer of the film type may include a stretched synthetic resin film, and the polarizer of the liquid crystal coating type may include liquid crystals arranged with a specific orientation. The phase retarder and the polarizer may be realized using a single polarizer film. According to some embodiments, the anti-reflection layer may be color filters, which are directly located on or embedded in the input-sensing panel ISP or the display panel DP.

The display device DD may be configured to display an image based on an electrical signal applied thereto and to transmit and receive information on an external input. The display device DD may include an active region AA and a peripheral region NAA. The active region AA may be used to display the image and to sense the external input. The active and peripheral regions AA and NAA may correspond to the image and bezel regions IA and BZA of FIG. 1A, respectively. In the present specification, an expression "a region corresponds to another region" may mean that the two regions are overlapped with each other, but the two regions do not have to have the same area.

The peripheral region NAA may be adjacent to the active region AA. For example, the peripheral region NAA may be provided to enclose the active region AA. However, embodiments of the inventive concept are not limited to this example, and according to some embodiments, the shape of the peripheral region NAA may be variously changed. According to some embodiments, the active region AA of the display device DD may correspond to at least a portion of the image region IA.

Referring to FIG. 2A, the input-sensing panel ISP may be directly located on the display panel DP. According to some embodiments of the inventive concept, the input-sensing panel ISP may be formed on the display panel DP through successive processes. That is, in the case where the input-sensing panel ISP is directly located on the display panel DP, the adhesive layer may not be located between the input-sensing panel ISP and the display panel DP.

However, a sub-adhesive ADL-S may be located between the input-sensing panel ISP and the display panel DP, as shown in FIG. 2B. In this case, the input-sensing panel ISP and the display panel DP may not be fabricated in a successive manner, and the input-sensing layer ISL may be fabricated by a process, which is different from a process for the display panel DP, and may be attached to a top surface of the display panel DP by the sub-adhesive layer ADL-S.

As shown in FIG. 2A, the window WM may include a light-blocking pattern WBM, which is used to define the bezel region BZA (e.g., see FIG. 1A). The light-blocking pattern WBM may be a colored organic layer and may be formed on a bottom surface WM-BS of the window WM by, for example, a coating method.

As shown in FIG. 2C, the display panel DP may include a base layer BL, a circuit device layer DP-CL, a display device layer DP-OLED, an encapsulation substrate EC, which are located on the base layer BL, and a sealant SM, which is formed to combine the base layer BL to the encapsulation substrate EC.

The base layer BL may include at least one plastic film. The base layer BL may include a plastic substrate, a glass substrate, a metal substrate, or a substrate formed of organic/inorganic composite material. According to some embodiments, the base layer BL may be a thin glass substrate whose thickness ranges from several tens of micrometers to several hundreds of micrometers. The base layer BL may have a multi-layered structure. For example, the base layer BL may include a polyimide layer, at least one inorganic layer, and a polyimide layer.

The circuit device layer DP-CL may include at least one insulating layer and at least one circuit device. The insulating layer may include at least one inorganic layer and at least one organic layer. The circuit device may include signal lines, a pixel driving circuit, or the like. This will be in more detail described below.

The display device layer DP-OLED may include at least a light-emitting device (e.g., organic light-emitting diodes). The display device layer DP-OLED may further include an organic layer, such as a pixel definition layer.

The encapsulation substrate EC may be spaced apart from the display device layer DP-OLED with a gap GP interposed therebetween. The base layer BL and the encapsulation substrate EC may include a plastic substrate, a glass substrate, a metal substrate, or a substrate made of an organic/inorganic composite material. The gap GP may be filled with a specific material. For example, a moisture absorbent material or a resin material may be provided to fill the gap GP.

The sealant SM may be extended along an edge of the base layer BL and may be located between the base layer BL and the encapsulation substrate EC to combine the base layer BL to the encapsulation substrate EC. The sealant SM may include an organic adhesive material, a frit, or the like.

As shown in FIG. 2D, the display panel DP may include the base layer BL and the circuit device layer DP-CL, the display device layer DP-OLED, and an upper insulating layer TFL, which are located on the base layer BL. The upper insulating layer TFL may include a plurality of thin films. At least one of the thin films may be provided to improve optical efficiency of the display panel DP, and at least one of the thin films may be provided to protect the organic light-emitting diodes. According to some embodiments, the upper insulating layer TFL may include at least an inorganic layer, and organic layer, and an inorganic layer.

Figure 3A:
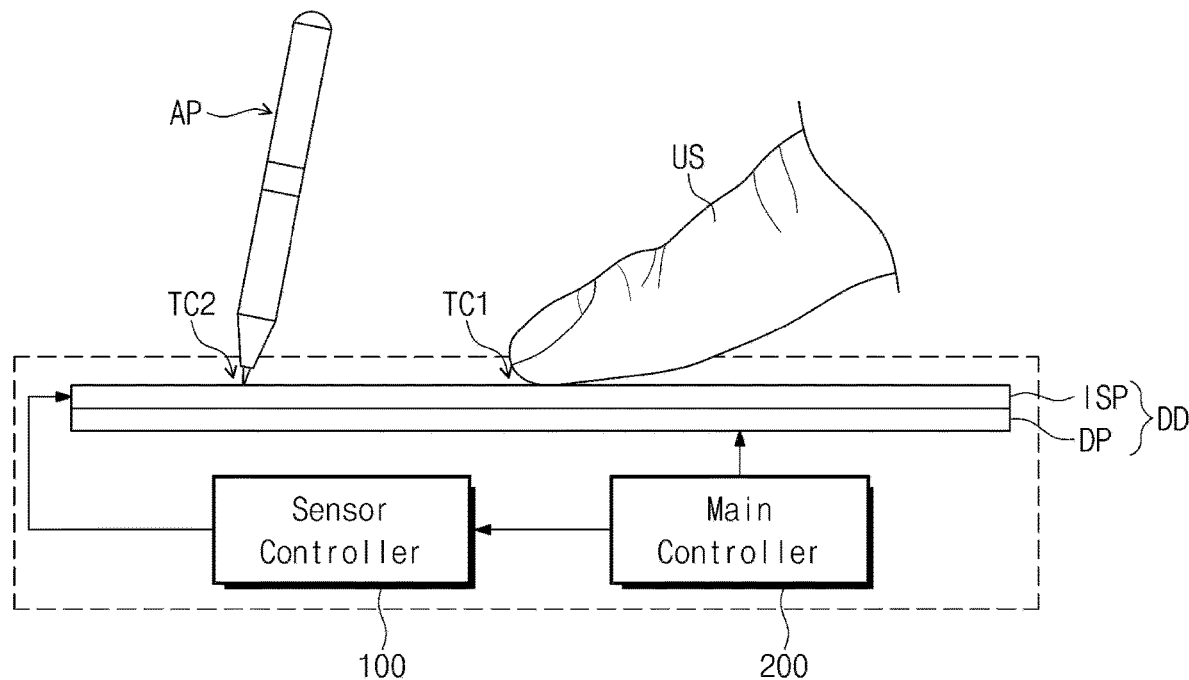
FIG. 3A is a block diagram illustrating an operation of an electronic device according to some embodiments of the inventive concept.
Figure 3B:
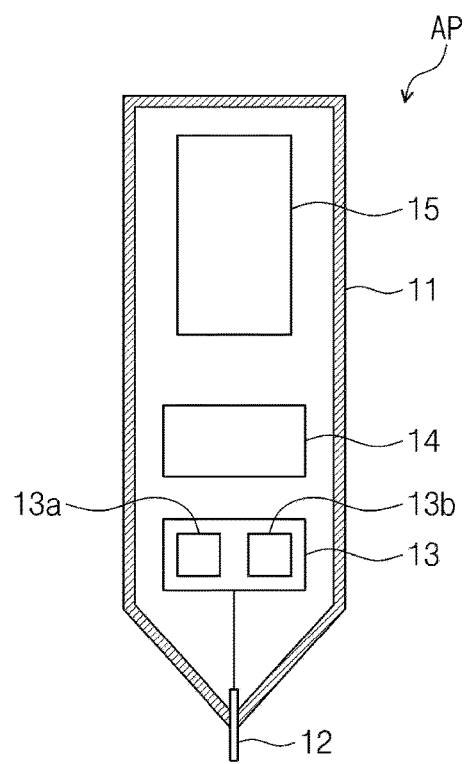
FIG. 3B is a block diagram illustrating the input apparatus of FIG. 3A.

FIG. 3A is a block diagram illustrating an operation of an electronic device according to some embodiments of the inventive concept. FIG. 3B is a block diagram illustrating the input apparatus of FIG. 3A.

Referring to FIGS. 3A and 3B, the electronic device ELD (e.g., see FIG. 1A) according to some embodiments of the inventive concept may further include a main controller 200, which is used to control an operation of the display device DD, and a sensor controller 100, which is connected to the input-sensing panel ISP the main controller 200 may control an operation of the sensor controller 100. According to some embodiments, the main controller 200 and the sensor controller 100 may be mounted on the main circuit board MCB (e.g., see FIG. 1B). According to some embodiments, the sensor controller 100 may be embedded in the first driving chip DIC1 (e.g., see FIG. 1B).

The input-sensing panel ISP may include sensing electrodes. The structure of the input-sensing panel ISP will be described in more detail below.

The sensor controller 100 may be connected to the sensing electrodes of the input-sensing panel ISP. The input-sensing panel ISP may be operated in a first mode of sensing the first input TC1 (e.g., see FIG. 1A) or in a second mode of sensing the second input TC2 (e.g., see FIG. 1A), under the control of the sensor controller 100.

As shown in FIG. 3B, the input apparatus AP may include a housing 11, a conductive tip 12, and a communication module 13. The housing 11 may have a pen shape and may have a storage space formed therein. The conductive tip 12 may be exposed to the outside of the housing 11 through an opened portion of the housing 11. The conductive tip 12 may be a portion of the input apparatus AP that is in direct contact with the input-sensing panel ISP.

The communication module 13 may include a transmission circuit 13a and a reception circuit 13b. The transmission circuit 13a may be configured to transmit a down-link signal to the sensor controller 100. The down-link signal min information on a position, slope, and state of the input apparatus AP. When the input apparatus AP is in contact with the input-sensing panel ISP, the sensor controller 100 may receive the down-link signal through the input-sensing panel ISP.

The reception circuit 13b may be formed to receive an up-link signal from the sensor controller 100. The up-link signal may include information on a panel and a protocol version. The sensor controller 100 may supply the up-link signal to the input-sensing panel ISP, and the input apparatus AP may receive the up-link signal, when the input apparatus AP is in contact with the input-sensing panel ISP.

The input apparatus AP may further include an input controller 14, which is used to control an operation of the input apparatus AP. The input controller 14 may be operated in accordance with a program (e.g., a set or predetermined program). The transmission circuit 13*a* may be configured to receive signals, which are supplied from the input controller 14, and to convert the received signals to signals, which can be sensed by the input-sensing panel ISP, and the reception circuit 13*b* may be configured to convert the signals, which are received through the input-sensing panel ISP, to signals, which can be processed by the input controller 14. The input apparatus AP may further include a power module 15, which is used to supply an electric power to the input apparatus AP.

Figure 4:
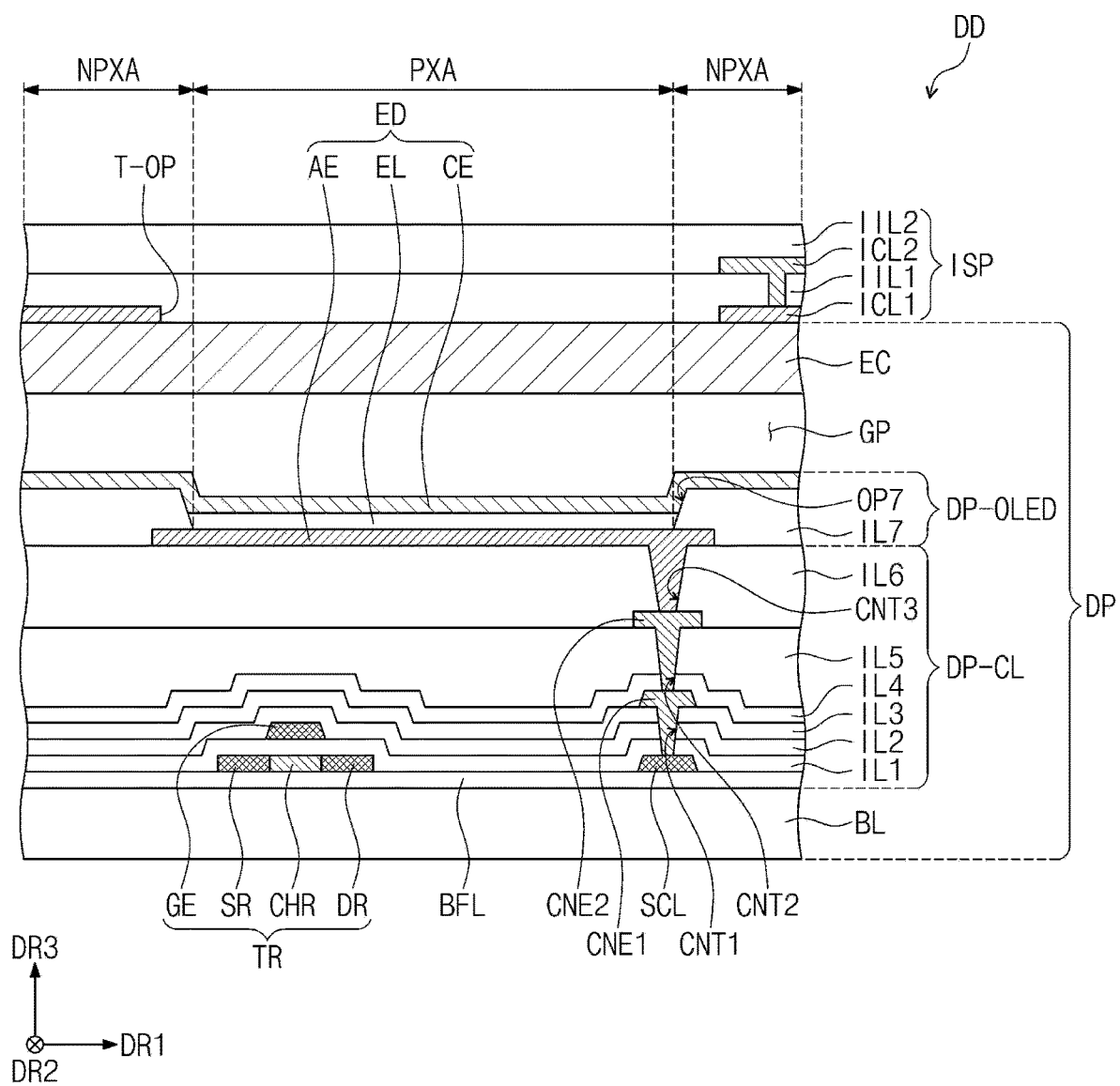
FIG. 4 is an enlarged sectional view illustrating a display device according to some embodiments of the inventive concept.

FIG. 4 is an enlarged sectional view illustrating a display device according to some embodiments of the inventive concept.

Referring to FIG. 4, the display device DD may include the display panel DP and the input-sensing panel ISP, which is directly located on the display panel DP. According to some embodiments, an adhesive layer may not be located between the display panel DP and the input-sensing panel ISP. The display panel DP may include the base layer BL, the circuit device layer DP-CL, the display device layer DP-OLED, and the encapsulation substrate EC.

The base layer BL may be provided to have a base surface, on which the circuit device layer DP-CL is located. The circuit device layer DP-CL may be located on the base layer BL. The circuit device layer DP-CL may include an insulating layer, a semiconductor pattern, a conductive pattern, and a signal line. The formation of the circuit device layer DP-CL may include forming an insulating layer, a semiconductor layer, and a conductive layer on the base layer BL using a coating or deposition method and then performing a photolithography process several times to selectively pattern the insulating layer, the semiconductor layer, and the conductive layer. Thereafter, the semiconductor pattern, the conductive pattern, and the signal line of the circuit device layer DP-CL may be formed.

At least one inorganic layer may be formed on a top surface of the base layer BL. The inorganic layer may be formed of or include at least one of aluminum oxide, titanium oxide, silicon oxide, silicon oxynitride, zirconium oxide, or hafnium oxide. For example, the at least one inorganic layer may include a plurality of inorganic layers forming a multi-layered structure. The multi-layered inorganic layers may be used as a barrier layer and/or a buffer layer. According to some embodiments, the display panel DP is illustrated to include a buffer layer BFL.

The buffer layer BFL may be provided to improve an adhesion strength between the base layer BL and the semiconductor pattern. The buffer layer BFL may include a silicon oxide layer and a silicon nitride layer, which are alternately stacked.

The semiconductor pattern may be located on the buffer layer BFL. The semiconductor pattern may be formed of or include polysilicon. However, embodiments of the inventive concept are not limited to this example, and according to some embodiments, the semiconductor pattern may be formed of or include at least one of amorphous silicon or metal oxides.

FIG. 4 illustrates a portion of the semiconductor pattern, but the semiconductor pattern may further include another portion located in other regions. According to some embodiments, the semiconductor patterns may be arranged throughout the pixels under a certain rule. Electrical characteristics of the semiconductor pattern may vary depending on its doping state. The semiconductor pattern may include a first region with high conductivity and a second region with low conductivity. The first region may be doped with n-type or p-type dopants. A p-type transistor may include an impurity region doped with p-type dopants. According to some embodiments, the second region may be an undoped region or may have a lower concentration than the first region.

The first region may have higher conductivity than the second region and may be substantially used as an electrode or a signal line. The second region may be substantially used as an active or channel region of a transistor. For example, a portion of the semiconductor pattern may be used as the active region of the transistor, and another portion may be used as a source or drain region of the transistor.

In an equivalent circuit structure, each of the pixels may be provided to include seven transistors, one capacitor, and an emission element, but the equivalent circuit structure of the pixel may be variously changed. A portion of the pixel, according to some embodiments, in which one transistor TR and an emission element ED are provided, is illustrated in FIG. 4.

A source region SR, a channel region CHR, and a drain region DR of the transistor TR may be formed from the semiconductor pattern. The source region SR and the drain region DR may be provided at opposite sides of the channel region CHR, when viewed in a sectional view. FIG. 4 illustrates an example, in which a portion of a signal line SCL is located at the same level as the semiconductor pattern. According to some embodiments, the signal line SCL may be electrically connected to the transistor TR, when viewed in a plan view.

A first insulating layer IL1 may be located on the buffer layer BFL. The first insulating layer IL1 may be overlapped in common with the pixels and may cover the semiconductor pattern. The first insulating layer IL1 may be an inorganic and/or organic layer and may have a single- or multi-layered structure. The first insulating layer IL1 may be formed of or include at least one of aluminum oxide, titanium oxide, silicon oxide, silicon nitride, silicon oxynitride, zirconium oxide, or hafnium oxide. According to some embodiments, the first insulating layer IL1 may be a single-layered silicon oxide layer. Not only the first insulating layer IL1 but also an insulating layer of the circuit device layer DP-CL to be described below may be an inorganic and/or organic layer and may have a single- or multi-layered structure. The inorganic layer may be formed of or include at least one of the afore-described materials, but embodiments of the inventive concept are not limited to this example.

A gate GE of the transistor TR may be located on the first insulating layer IL1. The gate GE may be a portion of a metal pattern. The gate GE may be overlapped with the channel region CHR. The gate GE may be used as a mask in a process of doping the semiconductor pattern.

A second insulating layer IL2 may be located on the first insulating layer IL1 to cover the gate GE. The second insulating layer IL2 may be overlapped in common with the pixels. The second insulating layer IL2 may be an inorganic and/or organic layer and may have a single- or multi-layered structure. According to some embodiments, the second insulating layer IL2 may be a single layer formed of silicon oxide.

A third insulating layer IL3 may be located on the second insulating layer IL2, and according to some embodiments, the third insulating layer IL3 may be a single layer formed of silicon oxide. A first connection electrode CNE1 may be located on the third insulating layer IL3. The first connection electrode CNE1 may be coupled to the signal line SCL through a contact hole CNT1 penetrating the first, second, and third insulating layer IL1, IL2, and IL3.

A fourth insulating layer IL4 may be located on the third insulating layer IL3. The fourth insulating layer IL4 may be a single layer formed of silicon oxide. A fifth insulating layer IL5 may be located on the fourth insulating layer IL4. The fifth insulating layer IL5 may be an organic layer.

A second connection electrode CNE2 may be located on the fifth insulating layer IL5. The second connection electrode CNE2 may be coupled to the first connection electrode CNE1 through a contact hole CNT2 penetrating the fourth and fifth insulating layers IL4 and IL5.

A sixth insulating layer IL6 may be located on the fifth insulating layer IL5 to cover the second connection electrode CNE2. The sixth insulating layer IL6 may be an organic layer. The display device layer DP-OLED may be located on the circuit device layer DP-CL. The display device layer DP-OLED may include the emission element ED. For example, the display device layer DP-OLED may include an organic light-emitting material, quantum dots, quantum rods, micro LEDs, or nano LEDs. The emission element ED may include a first electrode AE, an emission layer EL, and a second electrode CE.

The first electrode AE may be located on the sixth insulating layer IL6. The first electrode AE may be connected to the second connection electrode CNE2 through a contact hole CNT3 penetrating the sixth insulating layer IL6.

A pixel definition layer IL7 may be located on the sixth insulating layer IL6 to cover a portion of the first electrode AE. A display opening OP7 may be defined in the pixel definition layer IL7. The display opening OP7 of the pixel definition layer IL7 may expose at least a portion of the first electrode AE. According to some embodiments, a light-emitting region PXA may be defined to correspond to a region of the first electrode AE exposed by the display opening OP7. The non-light-emitting region NPXA may be provided to enclose the light-emitting region PXA. The non-light-emitting region NPXA may be defined as a region overlapped with the pixel definition layer IL7.

The emission layer EL may be located on the first electrode AE. The emission layer EL may be located in the display opening OP7. In other words, the emission layer EL may be formed to include a plurality of portions, which are respectively or separately located in the pixels. In the case where the emission layer EL includes the portions, which are respectively and separately located in the pixels, each portion of the emission layer EL may emit one of blue, red, and green lights. However, embodiments of the inventive concept are not limited to this example, and according to some embodiments, the emission layer EL may be provided in two or more pixels in common. In this case, the emission layer EL may be configured to emit a blue or whit light.

In the emission element ED according to some embodiments of the inventive concept, a hole control layer may be located between the first electrode AE and the emission layer EL. The hole control layer may be located in common in the light-emitting region PXA and the non-light-emitting region NPXA. The hole control layer may include a hole transport layer and, according to some embodiments, it may further include a hole injection layer. An electron control layer may be located between the emission layer EL and the second electrode CE. The electron control layer may include an electron transport layer and, according to some embodiments, it may further include an electron injection layer. The hole control layer and the electron control layer may be formed in common on a plurality of pixels, using an open mask.

The input-sensing panel ISP may be directly formed on a top surface of the encapsulation substrate EC in a successive manner. The input-sensing panel ISP may include a first conductive layer ICL1, a first sensing insulating layer IIL1, a second conductive layer ICL2, and a second sensing insulating layer IIL2. According to some embodiments, an inorganic layer may be further located between the top surface of the encapsulation substrate EC and the first conductive layer ICL1.

Each of the first and second conductive layers ICL1 and ICL2 may have a single-layered structure or may include a plurality of patterns, which are stacked in the third direction DR3 to form a multi-layered structure. The conductive layer of the single-layered structure may be formed of or include a metal layer or a transparent conductive layer. The first conductive layer ICL1 may include a plurality of conductive lines crossing each other and defining an open region T-OP, as will be described below. The open region T-OP may correspond to the light-emitting region PXA.

The metal layer may be formed of or include at least one of molybdenum, silver, titanium, copper, aluminum, or alloys thereof. The transparent conductive layer may include transparent conductive oxide, such as indium tin oxide (ITO), indium zinc oxide (IZO), zinc oxide (ZnO), or indium zinc tin oxide (IZTO). In certain embodiments, the transparent conductive layer may include a conductive polymer (e.g., PEDOT), metal nanowires, or graphene.

The conductive layer of the multi-layered structure may include a plurality of metal layers. For example, such metal layers constituting the conductive layer may have a triple-layered structure including, for example, titanium/aluminum/titanium layers. The conductive layer of the multi-layered structure may include at least one metal layer and at least one transparent conductive layer.

The first sensing insulating layer IIL1 may cover the first conductive layer ICL1, and the second sensing insulating layer IIL2 may cover the second conductive layer ICL2. Although the first and second sensing insulating layers IIL1 and IIL2 are illustrated to have a single-layered structure, embodiments of the inventive concept are not limited to this example.

At least one of the first or second sensing insulating layers IIL1 or IIL2 may include an inorganic layer. The inorganic layer may be formed of or include at least one of aluminum oxide, titanium oxide, silicon oxide, silicon nitride, silicon oxynitride, zirconium oxide, or hafnium oxide.

At least one of the first or second sensing insulating layers IIL1 or IIL2 may include an organic layer. The organic layer may be formed of or include at least one of acryl-based resins, methacryl-based resins, polyisoprene-based resins, vinyl-based resins, epoxy-based resins, urethane-based resins, cellulose-based resins, siloxane-based resins, polyimide-based resins, polyamide-based resins, or perylene-based resins.

Figure 5:
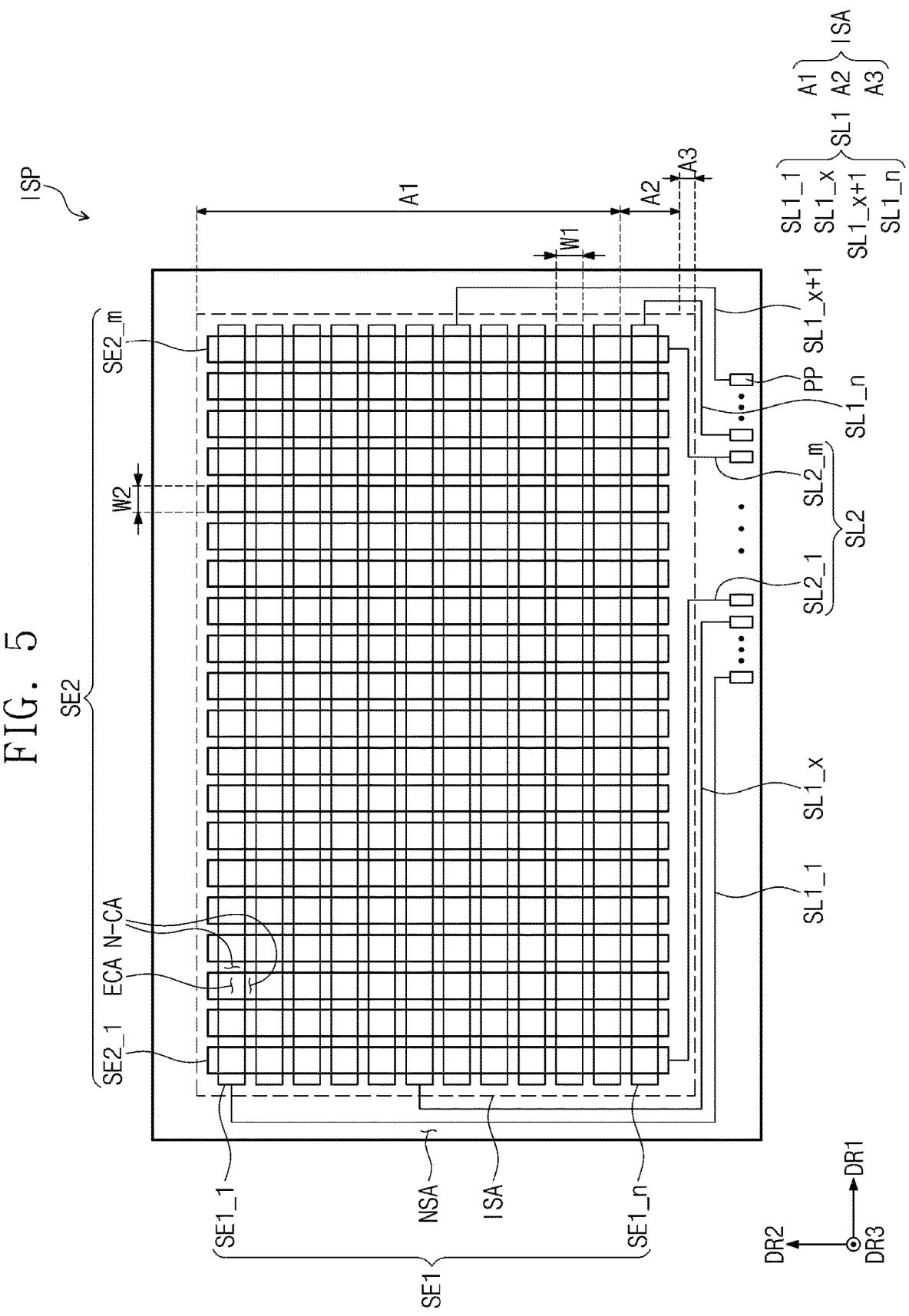
FIG. 5 is a plan view illustrating an input-sensing panel according to some embodiments of the inventive concept.
Figure 6:
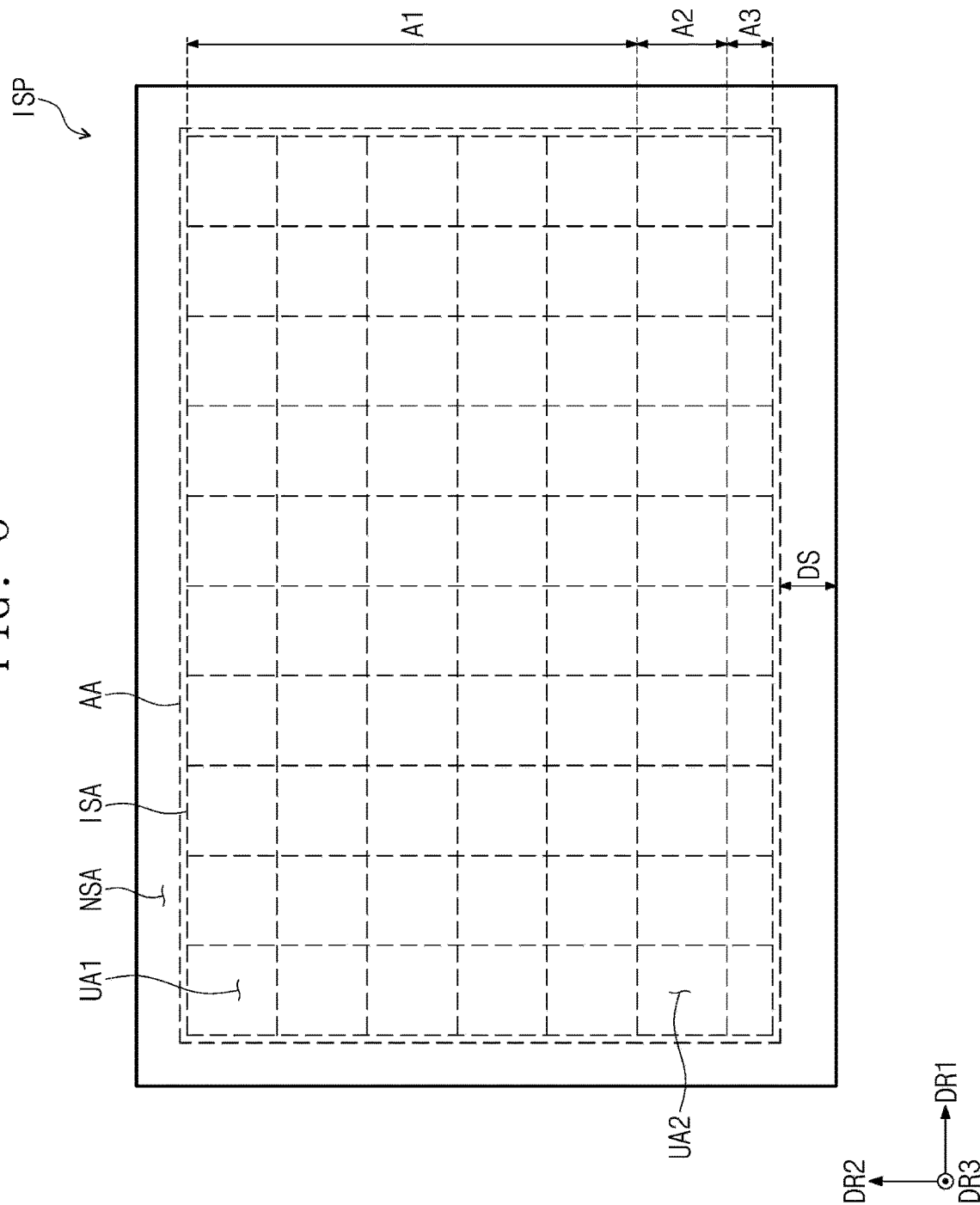
FIG. 6 is a plan view schematically illustrating the input-sensing panel of FIG. 5.

FIG. 5 is a plan view illustrating an input-sensing panel according to some embodiments of the inventive concept. FIG. 6 is a plan view schematically illustrating the input-sensing panel of FIG. 5.

Referring to FIGS. 3A and 5, the input-sensing panel ISP may include a sensing region ISA and a non-sensing or fourth region NSA. The sensing region ISA may be a region that is activated by an electrical signal. The sensing region ISA and the non-sensing region NSA may correspond to the active and peripheral regions AA and NAA, respectively, of the display device DD of FIG. 1B.

According to some embodiments, the sensing region ISA may include a first region A1, a second region A2, and a third region A3, which are sequentially arranged in the second direction DR2. The third region A3 may be spaced apart from the first region A1, and the second region A2 may be interposed therebetween. An area of the second region A2 may be smaller than an area of the first region A1 and may be larger than an area of the third region A3.

The input-sensing panel ISP may include sensing electrodes SE1 and SE2. A first sensing electrode SE1 may include first sensing electrodes SE1_1 to SE1_$n$, and a second sensing electrode SE2 may include second sensing electrodes SE2_1 to SE2_$m$. The first sensing electrodes SE1_1 to SE1_$n$ and the second sensing electrodes SE2_1 to SE2_$m$ may be electrically disconnected from each other and may be provided to cross each other. A region, in which the first and second sensing electrodes SE1_1 to SE1_$n$ and SE2_1 to SE2_$m$ are intersected with each other, may be defined as an electrode-intersection region ECA. A region, in which the first and second sensing electrodes SE1_1 to SE1_$n$ and SE2_1 to SE2_$m$ are not intersected with each other, may be defined as a non-intersection region N-CA.

According to some embodiments, each of the first sensing electrodes SE1_1 to SE1_$n$ may have a bar or stripe shape and may be extended in the first direction DR1. The first sensing electrodes SE1_1 to SE1_$n$ may be arranged to be spaced apart from each other in the second direction DR2. The first sensing electrodes SE1_1 to SE1_$n$ may have a width W1, which is substantially uniform in the second direction DR2. A distance between the first sensing electrodes SE1_1 to SE1_$n$ may be uniform in the second direction DR2.

Each of the second sensing electrodes SE2_1 to SE2_$m$ may have a bar or stripe shape and may be extended in the second direction DR2. The second sensing electrodes SE2_1 to SE2_$m$ may be arranged to be spaced apart from each other in in the first direction DR1. The second sensing electrodes SE2_1 to SE1_$m$ may have a width W2 which is substantially uniform in the first direction DR1. A distance between the second sensing electrodes SE2_1 to SE2_$m$ in the first direction DR1 may be uniform.

The input-sensing panel ISP may be operated in a first mode of obtaining information on the first input TC1 (e.g., see FIG. 3A) based on a variation in an electrostatic capacitance between the first and second sensing electrodes SE1_1 to SE1_$n$ and SE2_1 to SE2_$m$ or in a second mode of sensing the second input TC2 (e.g., see FIG. 3A) based on a variation in an electrostatic capacitance of each of the first and second sensing electrodes SE1_1 to SE1_$n$ and SE2_1 to SE2_$m$.

The input-sensing panel ISP may include first and second trace lines SL1 and SL2, which are connected to corresponding ones of the sensing electrodes SE1 and SE2. The first trace line SL1 may include a plurality of first trace lines SL1_1 to SL1_$n$, and the second trace line SL2 may include a plurality of second trace lines SL2_1 to SL2_$m$. According to some embodiments, the first trace lines SL1_1 to SL1_$n$ may be located in the non-sensing region NSA. The first trace lines SL1_1 to SL1_$n$ may be respectively and electrically connected to opposite portions of the first sensing electrodes SE1_1 to SE1_$n$.

For example, the first to x-th ones SL1_1 to SL1_$x$ of the first trace lines SL1_1 to SL1_$n$ may be connected to ends of the first sensing electrodes SE1_1 to SE1_$n$, respectively, which are located in a left upper region, and the (x+1)-th to n-th trace lines SL1_$x$+1 to SL1_$n$ of the first trace lines SL1_1 to SL1_$n$ may be connected to opposite ends of the first sensing electrodes SE1_1 to SE1_$n$, respectively, which are located in a right lower region. However, the connection structure of the first trace lines SL1_1 to SL1_$n$ is not limited to this example or a specific example.

The second trace lines SL2_1 to SL2_$m$ may be electrically connected to ends of the second sensing electrodes SE2_1 to SE2_$m$. According to some embodiments of the inventive concept, at least one of the second trace lines SL2_1 to SL2_$m$ may be located in the third region A3 of the sensing region ISA and the non-sensing region NSA (hereinafter, a fourth region).

That is, for the input-sensing panel ISP according to some embodiments of the inventive concept, at least one of the second trace lines SL2_1 to SL2_$m$ connecting the second sensing electrodes SE2_1 to SE2_$m$ to sensing pads PP may be located in the third region A3 that is overlapped with the active region AA (e.g., see FIG. 1B) of the display panel DP.

According to some embodiments of the inventive concept, because the second trace lines SL2_1 to SL2_$m$ are located in the third region A3, which is overlapped with the active region AA of the display panel DP, not in the non-sensing region NSA, it may be possible to reduce an additional space (e.g., a dead space) for the second trace lines SL2_1 to SL2_$m$, even when the second flexible circuit film FCB2 (e.g., see FIG. 1B) is coupled to the sensing pads PP in the non-sensing region NSA adjacent to the third region A3.

However, because the second trace lines SL2_1 to SL2_$m$, in or between which there is no variation of an electrostatic capacitance, are located in the third region A3 overlapped with the active region AA of the display panel DP, the sensing region ISA may require a compensation region, which is used to sense an external input applied to the third region A3.

According to some embodiments of the inventive concept, because compared with the first region A1, the second region A2 includes sensing electrodes with improved sensing sensitivity, it may be possible to provide the input-sensing panel ISP having uniform sensing sensitivity within the sensing region ISA, even when the third region A3 is overlapped with the active region AA of the display panel DP. This will be described in more detail below.

Referring to FIG. 6, the sensing region ISA, which is overlapped with the active region AA provided with the pixels of the display panel DP (e.g., see FIG. 4), may include the first region A1, the second region A2, and the third region A3, which are sequentially arranged in the second direction DR2. The sensing region ISA may include a plurality of unit sensing regions UA1 and UA2, which are arranged in a matrix shape.

According to some embodiments of the inventive concept, first unit sensing regions UA1 may be located in the first region A1 to form a matrix shape, and second unit sensing regions UA2 may be arranged in the first direction DR1 in the second region A2. However, embodiments of the inventive concept are not limited to this example, and according to some embodiments, the second unit sensing regions UA2, which are located in the second region A2, may be arranged in a matrix shape. According to some embodiments, one first unit sensing region UA1 may have the same area as one second unit sensing region UA2.

The third region A3 may be defined as a region, in which at least one of the second trace lines SL2_1 to SL2_$m$ described with reference to FIG. 5 is located. According to some embodiments of the inventive concept, because at least one of the second trace lines SL2_1 to SL2_$m$ is located in the active region AA (e.g., see FIG. 1B) provided with the pixels of the display panel DP, it may be possible to reduce a dead space DS of the non-sensing region NSA that is adjacent to the third region A3.

Figure 7A:
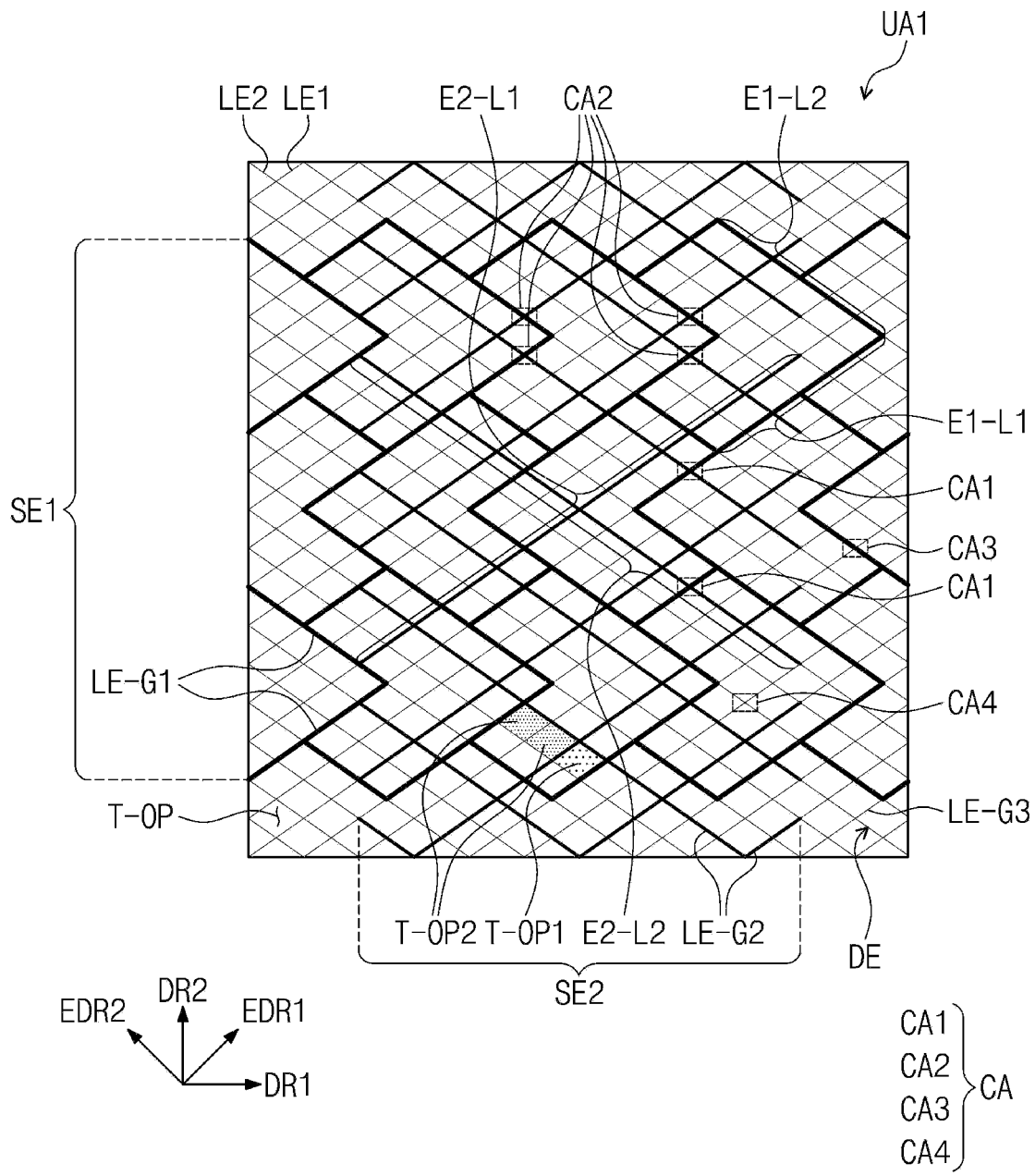
FIG. 7A is a plan view illustrating one of unit sensing regions of FIG. 6.
Figure 7B:
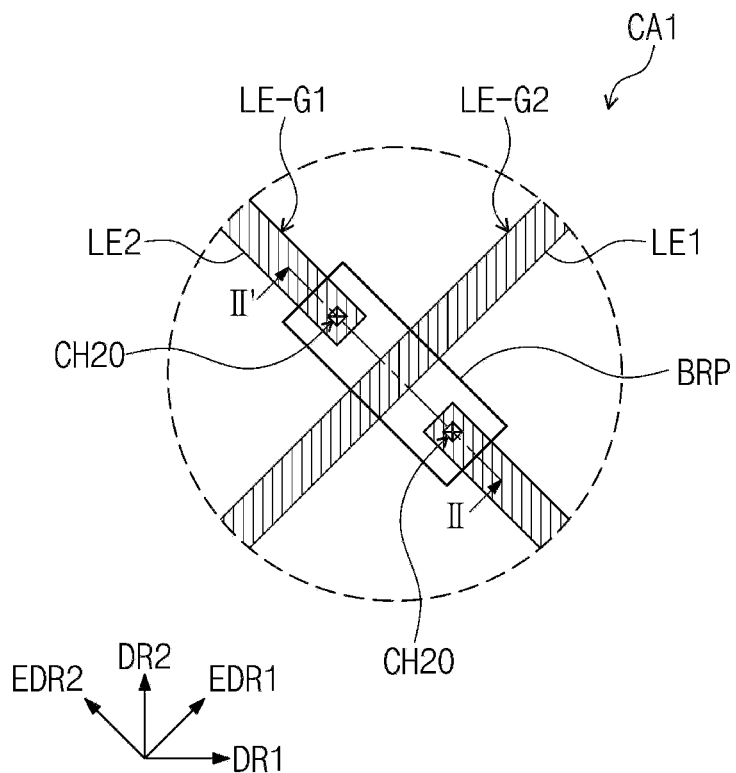
FIG. 7B is an enlarged plan view illustrating one of unit sensing regions of FIG. 7A.
Figure 7C:
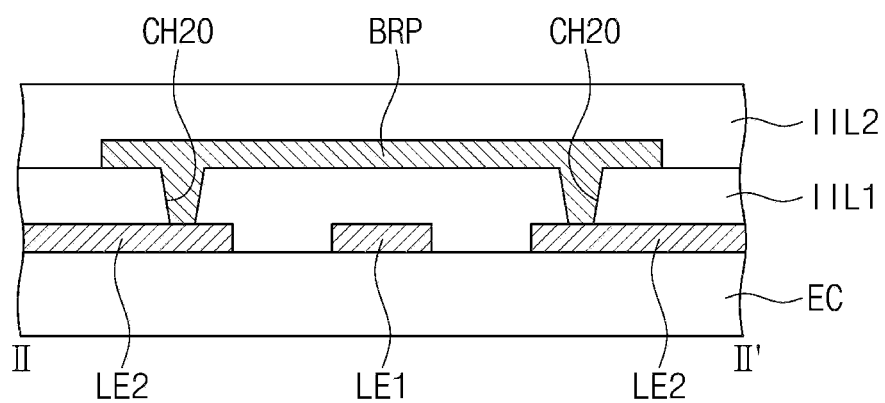
FIG. 7C is a sectional view of an input-sensing panel taken along a line II-II' of FIG. 7B.
Figure 7D:
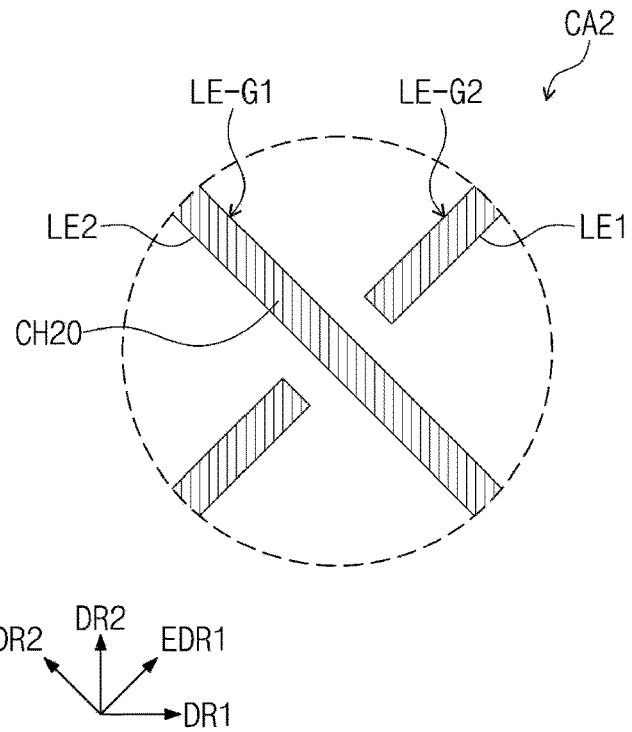
FIG. 7D is an enlarged plan view illustrating one of unit sensing regions shown in FIG. 7A.
Figure 7E:
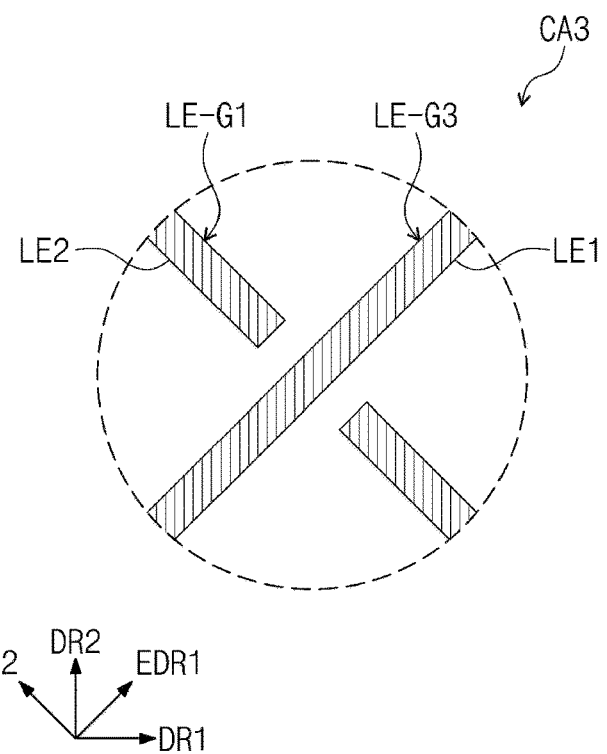
FIG. 7E is an enlarged plan view illustrating one of unit sensing regions of FIG. 7A.
Figure 7F:
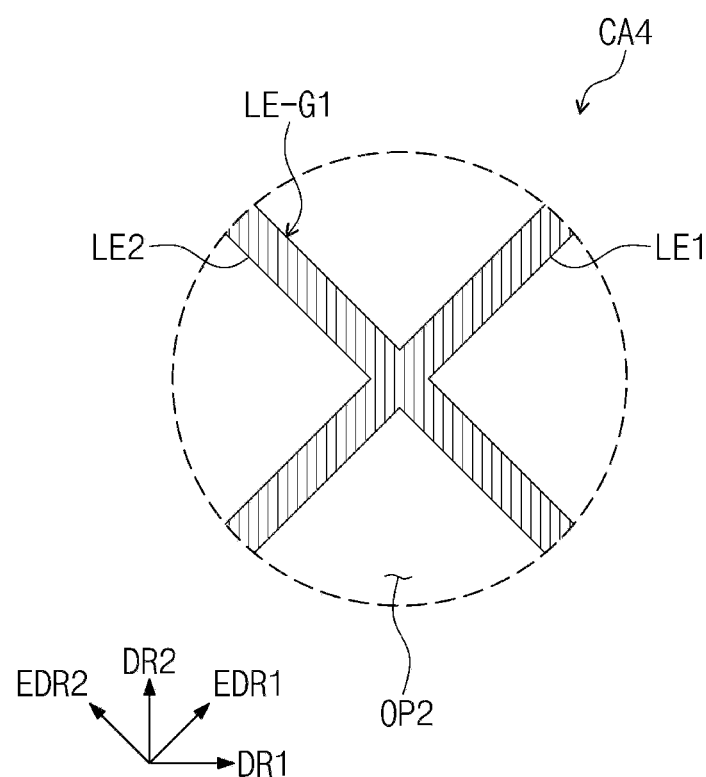
FIG. 7F is an enlarged plan view illustrating one of unit sensing regions shown in FIG. 7A.
Figure 7G:
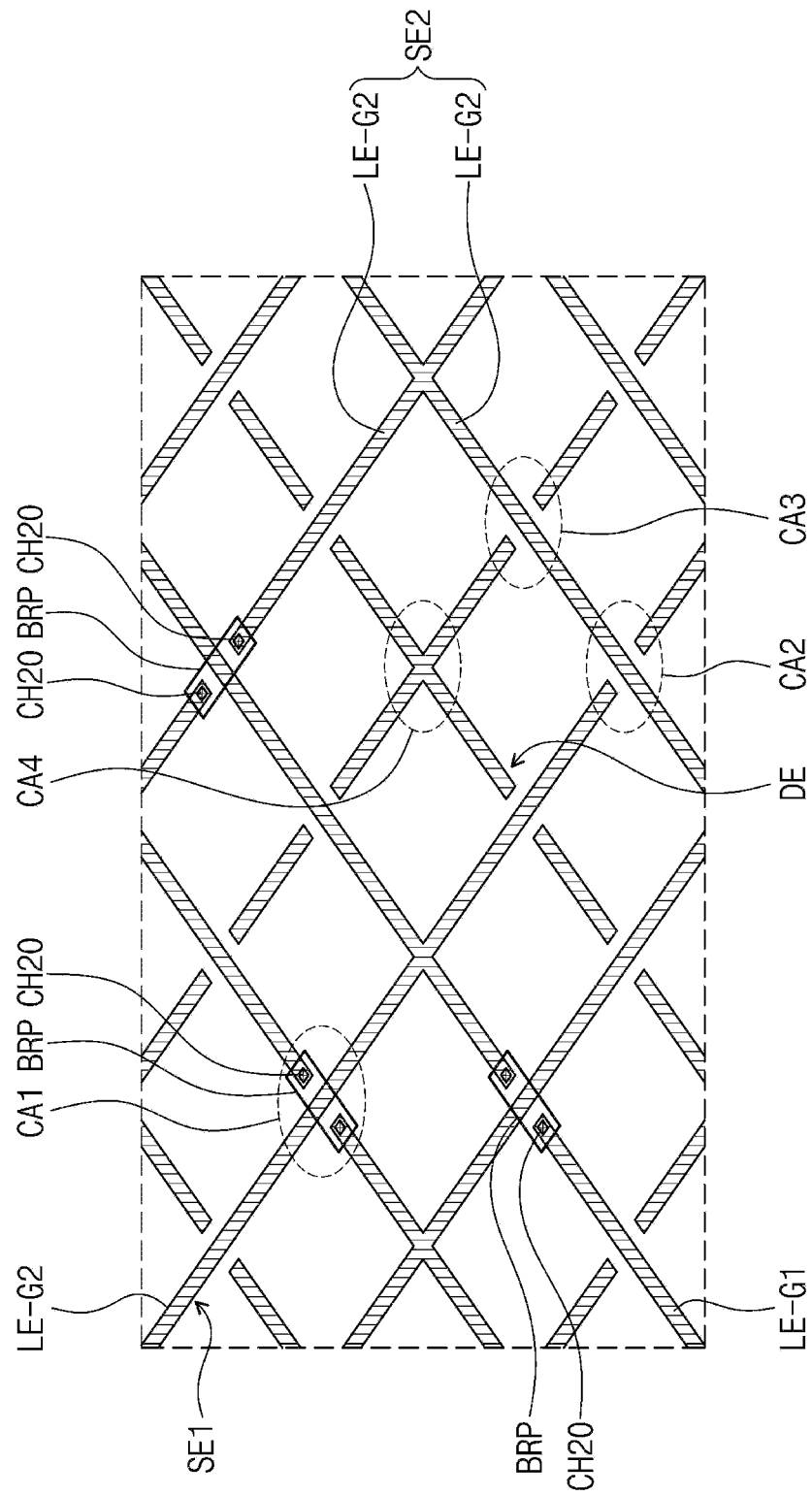
FIG. 7G is an enlarged plan view illustrating a region of FIG. 7A.
Figure 8:
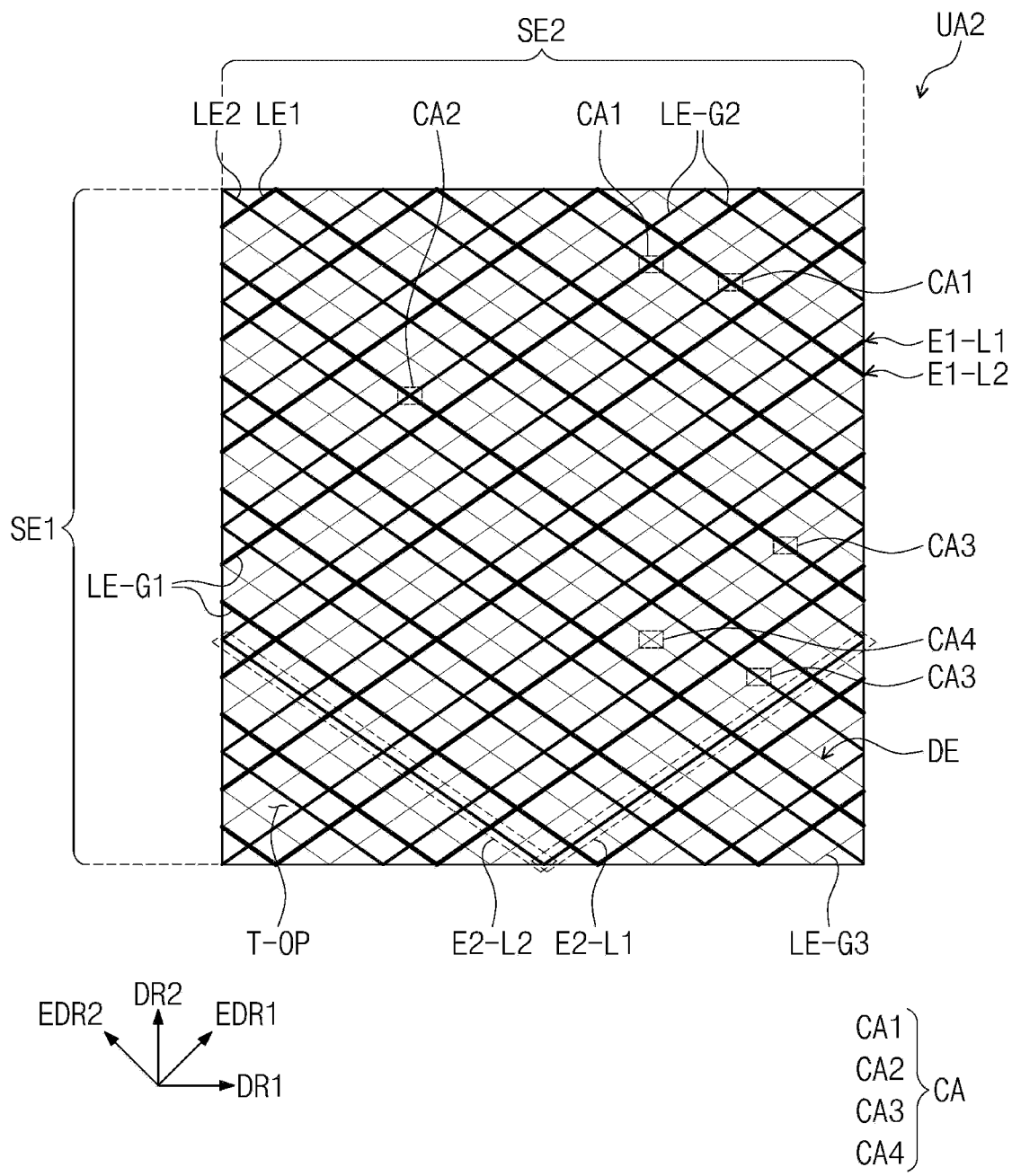
FIG. 8 is a plan view illustrating one of unit sensing regions of FIG. 6.
Figure 9A:
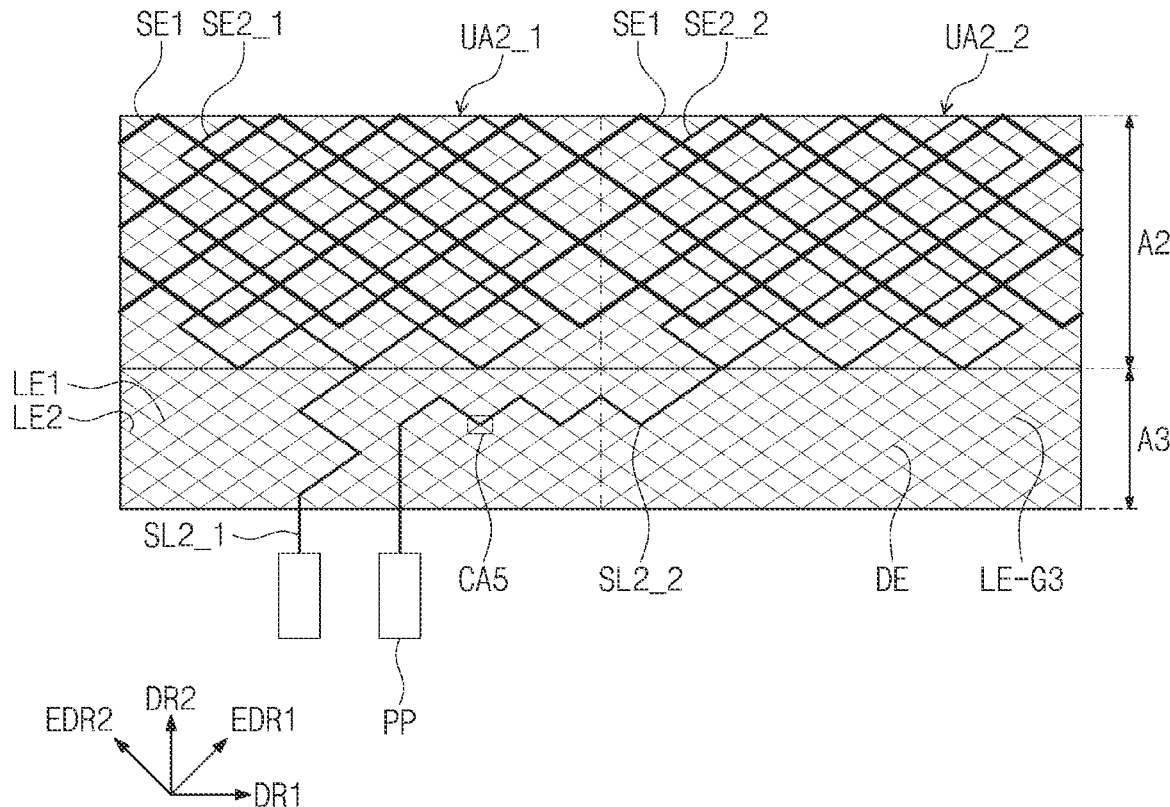
FIG. 9A is an enlarged plan view illustrating a region of an input-sensing panel according to some embodiments of the inventive concept.
Figure 9B:
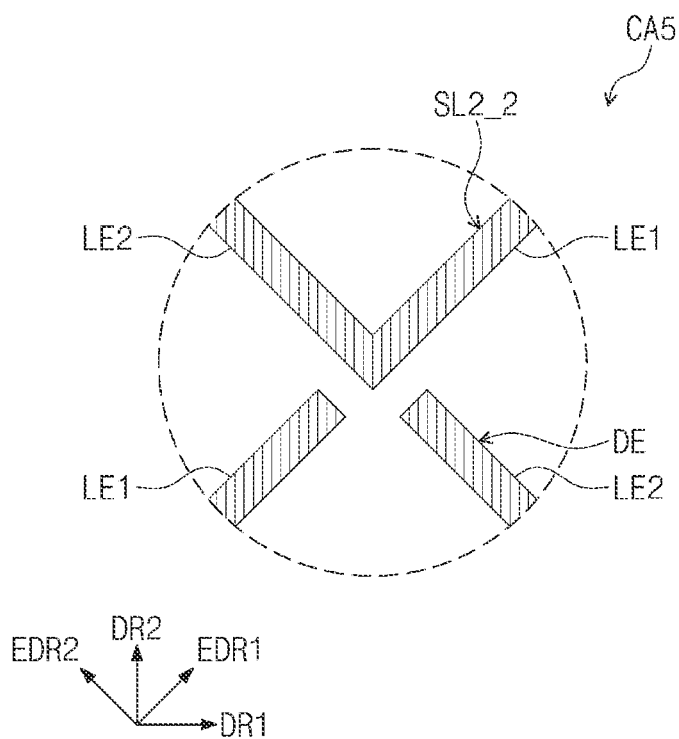
FIG. 9B is an enlarged plan view illustrating a region of FIG. 9A.

FIG. 7A is a plan view illustrating one of unit sensing regions of FIG. 6. FIG. 7B is an enlarged plan view illustrating one of unit sensing regions of FIG. 7A. FIG. 7C is a sectional view of an input-sensing panel taken along a line II-II' of FIG. 7B. FIG. 7D is an enlarged plan view illustrating one of unit sensing regions shown in FIG. 7A. FIG. 7E is an enlarged plan view illustrating one of unit sensing regions of FIG. 7A. FIG. 7F is an enlarged plan view illustrating one of unit sensing regions shown in FIG. 7A. FIG. 7G is an enlarged plan view illustrating a region of FIG. 7A. FIG. 8 is a plan view illustrating one of unit sensing regions of FIG. 6. FIG. 9A is an enlarged plan view illustrating a region of an input-sensing panel according to some embodiments of the inventive concept. FIG. 9B is an enlarged plan view illustrating a region of FIG. 9A.

FIG. 7A is an enlarged plan view illustrating one of the first unit sensing regions UA1 of the sensing region ISA located in the first region A1.

Referring to FIGS. 7A and 7G, the input-sensing panel ISP may have a mesh shape. The input-sensing panel ISP may include a plurality of first conductive lines LE1, which are extended in a first extension direction EDR1, and a plurality of second conductive lines LE2, which are extended in a second extension direction EDR2 crossing the first extension direction EDR1. The first and second conductive lines LE1 and LE2 may be arranged in the first and second directions DR1 and DR2 with a specific distance, and thus, the input-sensing panel ISP may have the mesh shape.

The first and second conductive lines LE1 and LE2 may define a plurality of intersection regions CA. When viewed in a plan view, the intersection regions CA may be imaginary intersection points, which are defined by the first and second conductive lines LE1 and LE2 spaced apart from each other, or may be real intersection points, which are defined by the first and second conductive lines LE1 and LE2 substantially intersecting each other.

When viewed in a plan view, the open region T-OP of the first unit sensing region UA1 may be a region, which corresponds to the smallest one of polygonal regions defined by the first and second conductive lines LE1 and LE2, and in which the first and second conductive lines LE1 and LE2 are not located. A polygon corresponding to the open region T-OP may be a diamond or lozenge. The open region T-OP may correspond to the light-emitting region PXA described with reference to FIG. 4. Thus, the first and second conductive lines LE1 and LE2 may be located on the pixel definition layer IL7 (e.g., see FIG. 4).

According to some embodiments, the first and second conductive lines LE1 and LE2 may include a first group of lines LE-G1, which are electrically connected to each other to define the first sensing electrode SE1, and a second group of lines LE-G2, which are electrically connected to each other to define the second sensing electrode SE2.

The first conductive lines LE1 of the lines LE-G1 of the first group may define first sensing electrode lines E1-L1 of the first sensing electrode SE1. The second conductive lines LE2 of the lines LE-G1 of the first group may define second sensing electrode lines E1-L2 of the first sensing electrode SE1. The first conductive lines LE1 of the lines LE-G2 of the second group may define first sensing electrode lines E2-L1 of the second sensing electrode SE2. The second conductive lines LE2 of the lines LE-G2 of the second group may define second sensing electrode lines E2-L2 of the second sensing electrode SE2.

The first sensing electrode line E1-L1 of the first sensing electrode SE1 and the first sensing electrode line E2-L1 of the second sensing electrode SE2 may be parallel to each other, and the second sensing electrode line E1-L2 of the first sensing electrode SE1 and the second sensing electrode line E2-L2 of the second sensing electrode SE2 may be parallel to each other.

The first sensing electrode line E2-L1 of the second sensing electrode SE2 may be located to be adjacent to one of the first sensing electrode lines E1-L1 of the first sensing electrode SE1. One open region T-OP1 may be located between the adjacent one of the first sensing electrode line E2-L1 of the second sensing electrode SE2 and the first sensing electrode line E1-L1 of the first sensing electrode SE1, and two open regions T-OP2 may be located between a distant one of the first sensing electrode line E2-L1 of the second sensing electrode SE2 and the first sensing electrode line E1-L1 of the first sensing electrode SE1.

The first and second conductive lines LE1 and LE2 may further include a third group of lines LE-G3, which are provided to define a dummy electrode DE electrically disconnected from the first and second sensing electrodes SE1 and SE2.

The formation of the first sensing electrode SE1, the second sensing electrode SE2, and the dummy electrode DE, which are electrically disconnected from each other, may include forming the first and second conductive lines LE1 and LE2, which are connected to each other, and cutting the first and second conductive lines LE1 and LE2 to form three different groups of the lines LE-G1, LE-G2, and LE-G3 from them under a specific rule. The cut region may correspond to an imaginary intersection point to be described below.

For convenience in description, the first and second conductive lines LE1 and LE2 of the lines LE-G3 of the third group, which constitute the dummy electrode DE, may be defined as "first dummy conductive lines and second dummy conductive lines".

In FIG. 7A, three groups of the lines LE-G1, LE-G2, and LE-G3 are differently illustrated for differentiation therebetween, but the lines LE-G1 of the first group, the lines LE-G2 of the second group, and the lines LE-G3 of the third group may be substantially the same in line width, thickness, and material. The lines LE-G1 of the first group, the lines LE-G2 of the second group, and the lines LE-G3 of the third group may be differentiated from each other based on an electric connection structure thereof.

The intersection region CA will be described in more detail with reference to FIGS. 7B to 7F. The intersection region CA may include first to fourth intersection regions CA1 to CA4.

Referring to FIGS. 7B, 7C, and 7G, one of the first and second conductive lines LE1 and LE2 of the lines LE-G1 of the first group may be provided to cross one of the first and second conductive lines LE1 and LE2 of the lines LE-G2 of the second group.

FIG. 7B illustrates the first intersection region CA1, in which the second conductive line LE2 of the lines LE-G1 of the first group and the first conductive line LE1 of the lines LE-G2 of the second group are provided to define an imaginary intersection point. Although FIG. 7B illustrates the first intersection region CA1, in which the second conductive line LE2 of the lines LE-G1 of the first group is cut and the first conductive line LE1 of the lines LE-G2 of the second group is arranged to pass through the cut region, but embodiments of the inventive concept are not limited to this example. According to some embodiments, the first conductive line LE1 of the lines LE-G2 of the second group may be cut in the first intersection region CA1.

Referring to FIG. 7C, the first and second conductive lines LE1 and LE2 may be directly located on the top surface of the encapsulation substrate EC. Thus, the first and second conductive lines LE1 and LE2 may be formed on the encapsulation substrate EC without any adhesive layer therebetween (i.e., by successive processes).

The first sensing insulating layer IIL1 may be provided to cover the first and second conductive lines LE1 and LE2. A bridge pattern BRP may be located on the first sensing insulating layer IIL1 to connect cut portions of the second conductive line LE2 of the lines LE-G1 of the first group to each other through contact holes CH20.

However, embodiments of the inventive concept are not limited to this example; for example, the bridge pattern BRP may be directly located on the encapsulation substrate EC, and the first and second conductive lines LE1 and LE2 may be formed on the first sensing insulating layer IIL1.

Each of the sensing pads PP of FIG. 5 may include a first pattern, which is located on the encapsulation substrate EC, and a second pattern, which is located on the first sensing insulating layer IIL1 and is overlapped with the first pattern. The second pattern may be connected to the first pattern through a contact hole, which is defined in the first sensing insulating layer IIL1. The second sensing insulating layer IIL2 may be provided to define pad openings exposing the sensing pads PP.

Each of the first and second trace lines SL1_1 to SL1_n and SL2_1 to SL2_m described with reference to FIG. 5 may have a double-layered structure including a first interconnection layer, which is located on the encapsulation substrate EC, and a second interconnection layer, which is located on the first sensing insulating layer IIL1, is overlapped with the first interconnection layer, and is connected to the first interconnection layer through a contact hole defined in the first sensing insulating layer IIL1.

However, embodiments of the inventive concept are not limited to this example, and according to some embodiments, each of the first and second trace lines SL1_1 to SL1_n and SL2_1 to SL2_m may have a single-layered interconnection layer, which is located on the encapsulation substrate EC or the first sensing insulating layer IIL1.

Referring to FIGS. 7D and 7G, one of the first and second conductive lines LE1 and LE2 of the lines LE-G1 of the first group may be provided to cross one of the first and second conductive lines LE1 and LE2 of the lines LE-G2 of the second group. FIG. 7D illustrates the second intersection region CA2, in which the second conductive line LE2 of the lines LE-G1 of the first group and the first conductive line LE1 of the lines LE-G2 of the second group are provided to define an imaginary intersection point. FIG. 7D illustrates an example, in which the first conductive line LE1 of the lines LE-G2 of the second group is cut. The bridge pattern BRP may not be located in the second intersection region CA2, unlike the first intersection region CA1.

By adjusting the number of the bridge patterns BRP, it may be possible to control a resistance value of the first or second sensing electrode SE1 or SE2 and/or an amount of an electric current flowing through the first or second sensing electrode SE1 or SE2. The bridge pattern BRP may be located in the second intersection region CA2 causing a small effect on a current flow. For example, when a current of the first sensing electrode SE1 flows in the first direction DR1, the second intersection region CA2 may cause a small effect on the current flow, because the second intersection region CA2 is a region inducing a current flow in the second direction DR2. Thus, the bridge pattern BRP connecting the first or second conductive line LE1 or LE2 of the first sensing electrode SE1 may not be located.

Referring to FIGS. 7E and 7G, one of the first conductive line LE1 of the lines LE-G1 of the first group, the second conductive line LE2 of the lines LE-G1 of the first group, the first conductive line LE1 of the lines LE-G2 of the second group, and the second conductive line LE2 of the lines LE-G2 of the second group may be provided to cross one of the first conductive line LE1 (hereinafter, a first dummy conductive line) of the lines LE-G3 of the third group and the second conductive line LE2 (hereinafter, a second dummy conductive line) of the lines LE-G3 of the third group. FIG. 7E illustrates the third intersection region CA3, in which the second conductive line LE2 of the lines LE-G1 of the first group and the first conductive line LE1 of the lines LE-G3 of the third group are provided to define an imaginary intersection point. Similar to the second intersection region CA2, the bridge pattern BRP may not be located in the third intersection region CA3. FIG. 7E illustrates an example, in which the second conductive line LE2 of the lines LE-G1 of the first group is cut, but embodiments of the inventive concept are not limited to this example. The first conductive line LE1 of the lines LE-G3 of the third group may be cut.

The third intersection region CA3 may define borders of the first sensing electrode SE1, the second sensing electrode SE2, and the dummy electrode DE. Because the first or second conductive line LE1 or LE2, which is provided in one of the first sensing electrode SE1, the second sensing electrode SE2, and the dummy electrode DE, is spaced apart from the first or second conductive line LE1 or LE2, which is provided in another of the first sensing electrode SE1, the second sensing electrode SE2, and the dummy electrode DE, the first sensing electrode SE1, the second sensing electrode SE2, and the dummy electrode DE may be electrically disconnected from each other.

Referring to FIGS. 7F and 7G, the first and second conductive lines LE1 and LE2 of the lines LE-G1 of the first group may be provided to form a single object and to cross each other, the first and second conductive lines LE1 and LE2 of the lines LE-G2 of the second group may be provided to form a single object and to cross each other, and the first and second conductive lines LE1 and LE2 of the lines LE-G3 of the third group may be provided to form a single object and to cross each other. FIG. 7F illustrates the fourth intersection region CA4, in which the first and second conductive lines LE1 and LE2 of the lines LE-G1 of the first group are provided to define a real intersection point. The bridge pattern BRP may be omitted in the fourth intersection region CA4.

Referring to FIG. 7G, an open region, which is defined by the first and second conductive lines LE1 and LE2 to be adjacent to the first intersection region CA1, may have an opened diamond shape. An open region, which is defined by the first and second conductive lines LE1 and LE2 to be adjacent to the second intersection region CA2, may have an opened diamond shape. An open region, which is defined by the first and second conductive lines LE1 and LE2 to be adjacent to the third intersection region CA3, may have an opened diamond shape. Adjacent ones of the open regions may be connected to each other by the opened diamond shaped region. An open region, which is defined by the first and second conductive lines LE1 and LE2 to be adjacent to the fourth intersection region CA4, may have an opened diamond shape. According to some embodiments, an open region, which is defined by the first and second conductive lines LE1 and LE2 to be adjacent to the fourth intersection region CA4 located in the dummy electrode DE, may have a closed diamond shape.

FIG. 8 is an enlarged plan view illustrating one second unit sensing region UA2, which is located in the second region A2 of the sensing region ISA (e.g., see FIG. 6).

Referring to FIG. 8, the input-sensing panel ISP may have a mesh shape. The input-sensing panel ISP may include the first conductive lines LE1, which are extended in a first extension direction EDR1, and the second conductive lines LE2, which are extended in a second extension direction EDR2 crossing the first extension direction EDR1. The first and second conductive lines LE1 and LE2 may be arranged in the first and second directions DR1 and DR2 with a specific distance, and thus, the input-sensing panel ISP may have the mesh shape.

The first and second conductive lines LE1 and LE2 may define a plurality of the intersection regions CA. The intersection regions CA defined in the second unit sensing region UA2 may be configured to have substantially the same features as the intersection regions CA described with reference to FIG. 7A to 7G.

When viewed in a plan view, the open region T-OP of the second unit sensing region UA2 may be a region, which corresponds to the smallest one of polygonal regions defined by the first and second conductive lines LE1 and LE2, and in which the first and second conductive lines LE1 and LE2 are not located. A polygon corresponding to the open region T-OP may be a diamond or lozenge. The open region T-OP may correspond to the light-emitting region PXA described with reference to FIG. 4. Thus, the first and second conductive lines LE1 and LE2 may be located on the pixel definition layer IL7 (e.g., see FIG. 4).

According to some embodiments, the lines LE-G1 of the first group, among the first and second conductive lines LE1 and LE2, may be electrically connected to each other to define the first sensing electrode SE1, and the lines LE-G2 of the second group, among the first and second conductive lines LE1 and LE2, may be electrically connected to each other to define the second sensing electrode SE2.

The first conductive lines LE1 of the lines LE-G1 of the first group may define the first sensing electrode lines E1-L1 of the first sensing electrode SE1. The second conductive lines LE2 of the lines LE-G1 of the first group may define the second sensing electrode lines E1-L2 of the first sensing electrode SE1. The first conductive lines LE1 of the lines LE-G2 of the second group may define the first sensing electrode lines E2-L1 of the second sensing electrode SE2. The second conductive lines LE2 of the lines LE-G2 of the second group may define the second sensing electrode lines E2-L2 of the second sensing electrode SE2.

The lines LE-G3 of the third group, among the first and second conductive lines LE1 and LE2, may define the dummy electrode DE, which is electrically disconnected from the first sensing electrode SE1 and the second sensing electrode SE2.

The formation of the first sensing electrode SE1, the second sensing electrode SE2, and the dummy electrode DE, which are electrically disconnected from each other, may include forming the first and second conductive lines LE1 and LE2, which are connected to each other, and cutting the first and second conductive lines LE1 and LE2 to form three different groups of the lines LE-G1, LE-G2, and LE-G3 from them under a specific rule.

According to some embodiments of the inventive concept, a density per unit area of the conductive lines LE1 and LE2 may be higher in the second region A2 than in the first region A1.

In the present specification, an expression "per unit area" may be defined based on an area of a corresponding one of the first or second unit sensing regions UA1 or UA2. In the present specification, the term "density" may be defined as an occupying area of the conductive lines LE1 and LE2 in the first or second unit sensing region UA1 or UA2 with the same area.

Because the density per unit area of the conductive lines LE1 and LE2 is high in the second region A2, the number of the conductive lines LE1 and LE2 located in the second unit sensing region UA2 of the second region A2 may be greater than the number of the conductive lines LE1 and LE2 located in the first unit sensing region UA1 of the first region A1.

Thus, a density per unit area of the dummy conductive lines LE1 and LE2 of the dummy electrode DE may be lower in the second unit sensing region UA2 than in the first unit sensing region UA1.

According to some embodiments of the inventive concept, because the density per unit area of the conductive lines LE1 and LE2 is higher in the second region A2 than in the first region A1, sensing sensitivity may be higher in the second region A2 than in the first region A1.

Two second unit sensing regions UA2_1 and UA2_2, which are included in the second region A2, and a portion of the third region A3, which is adjacent to the second unit sensing regions UA2_1 and UA2_2, are illustrated in FIG. 9A. The second unit sensing regions UA2_1 and UA2_2 may be configured to have substantially the same features as the second unit sensing region UA2 described with reference to FIG. 8.

According to some embodiments of the inventive concept, at least one of the second trace lines SL2_1 to SL2_*m* (e.g., see FIG. 5) may be located in the third region A3. The third region A3 may be overlapped with the active region AA, to which light generated by the display panel DP (e.g., see FIG. 4) is provided.

FIGS. 9A and 9B illustrate connection structures of the (2-1)-th and (2-2)-th trace lines SL2_1 and SL2_2, and here, the connection structures in the second unit sensing regions adjacent to the third region A3 may be substantially the same as that described with reference to FIGS. 9A and 9B.

The first sensing electrodes SE1 may be located in the second unit sensing regions UA2_1 and UA2_2 and may be extended in the first direction DR1 to receive the same signal. An end and/or opposite end of the first sensing electrode SE1 may be connected to one of the first trace lines SL1_1 to SL1_*n* described with reference to FIG. 5, and the first trace line, which is connected to the first sensing electrode SE1, may be located in the non-sensing region NSA.

According to some embodiments, the (2-1)-th trace line SL2_1 located in the third region A3 may be connected to a (2-1)-th sensing electrode SE2_1 located in the (2-1)-th unit sensing region UA2_1, and the (2-2)-th trace line SL2_2 located in the third region A3 may be connected to a (2-2)-th sensing electrode SE2_2 located in the (2-2)-th unit sensing region UA2_2. The (2-1)-th sensing electrode SE2_1 and the (2-2)-th sensing electrode SE2_2 may be provided with different signals from each other.

The lines LE-G3 of the third group, among the first and second conductive lines LE1 and LE2, may define the dummy electrode DE, which is electrically disconnected from the first sensing electrode SE1 and the second sensing electrodes SE2_1 and SE2_2.

The dummy electrode DE, which is located in the third region A3, may be electrically disconnected from the (2-1)-th trace line SL2_1 and the (2-2)-th trace line SL2_2.

According to some embodiments, a density per unit area of the dummy conductive lines LE1 and LE2 of the dummy electrode DE may be higher in the third region A3 than in the first unit sensing region UA1.

FIG. 9B illustrates a fifth intersection region CA5, in which the (2-2)-th trace line SL2_2 and the first and second conductive lines LE1 and LE2 of the lines LE-G3 of the third group are provided to define an imaginary intersection point. The first and second conductive lines LE1 and LE2 of the lines LE-G3 of the third group may be disconnected from the (2-2)-th trace line SL2_2 at the intersection point.

The (2-2)-th trace line SL2_2 may be extended in the same direction as the first and second conductive lines LE1 and LE2 and may be connected to the sensing pad PP. Thus, even when the (2-2)-th trace line SL2_2 is located in the third region A3, transmission of light generated in the display panel DP (e.g., see FIG. 4) may not be affected by the (2-2)-th trace line SL2_2.

According to some embodiments of the inventive concept, because the conductive lines LE1 and LE2, which are used to sense the variation of the electrostatic capacitance and have a density per unit area higher in the second region A2 than in the first region A1, are located in the input-sensing panel ISP (e.g., see FIG. 5), a reduction of the sensing sensitivity in the third region A3 may be compensated, even when the third region A3 is located in the active region AA of the display panel DP (e.g., see FIG. 4). Accordingly, it may be possible to realize the input-sensing panel ISP with a reduced dead space DS (e.g., see FIG. 6) and moreover to realize the electronic device ELD (e.g., see FIG. 1) including the input-sensing panel ISP with uniform sensing sensitivity.

Figure 10:
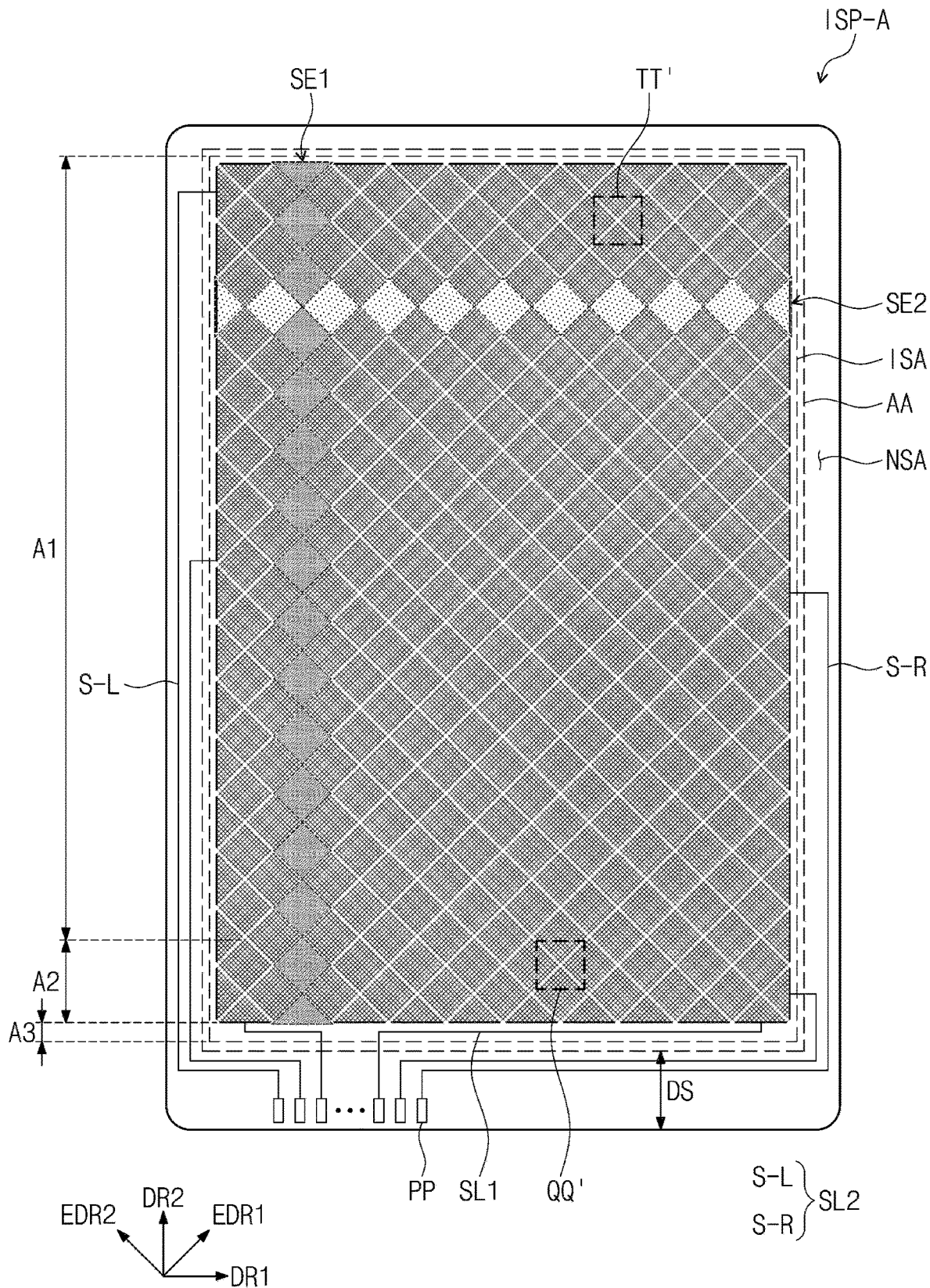
FIG. 10 is a plan view illustrating an input-sensing panel according to some embodiments of the inventive concept.
Figure 11A:
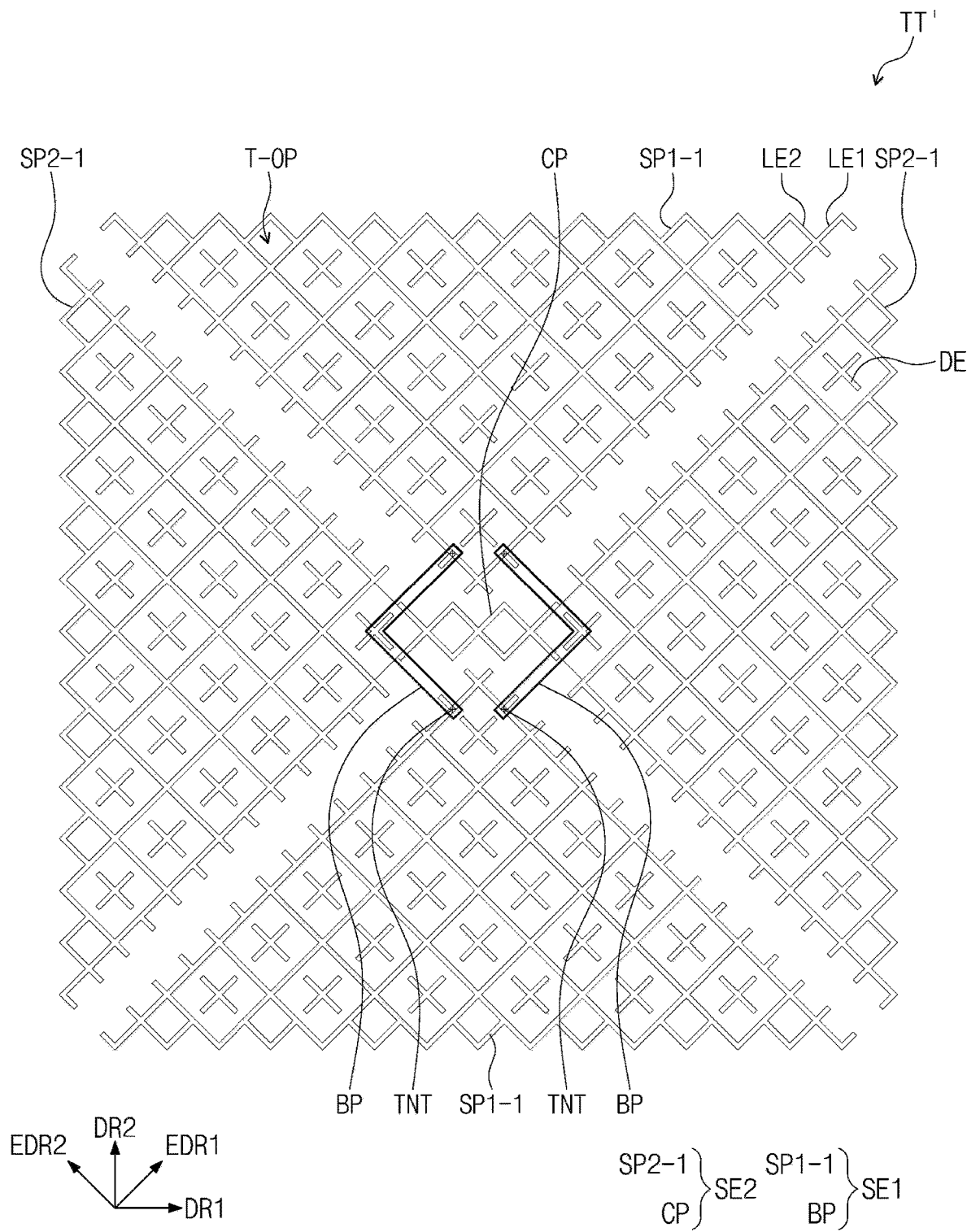
FIG. 11A is an enlarged plan view illustrating a region TT' of FIG. 10.
Figure 11B:
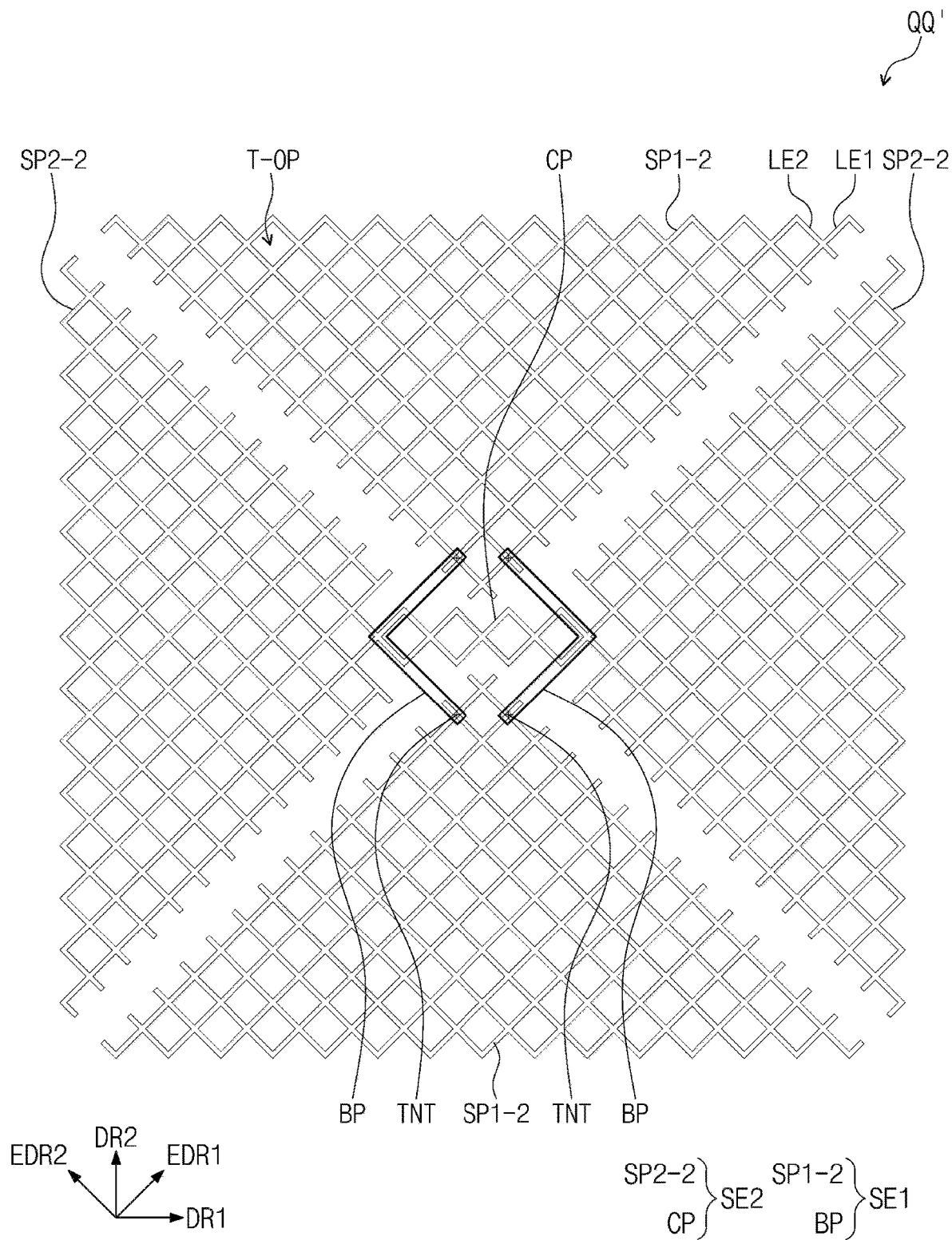
FIG. 11B is an enlarged plan view illustrating a region QQ' of FIG. 10.
Figure 12:
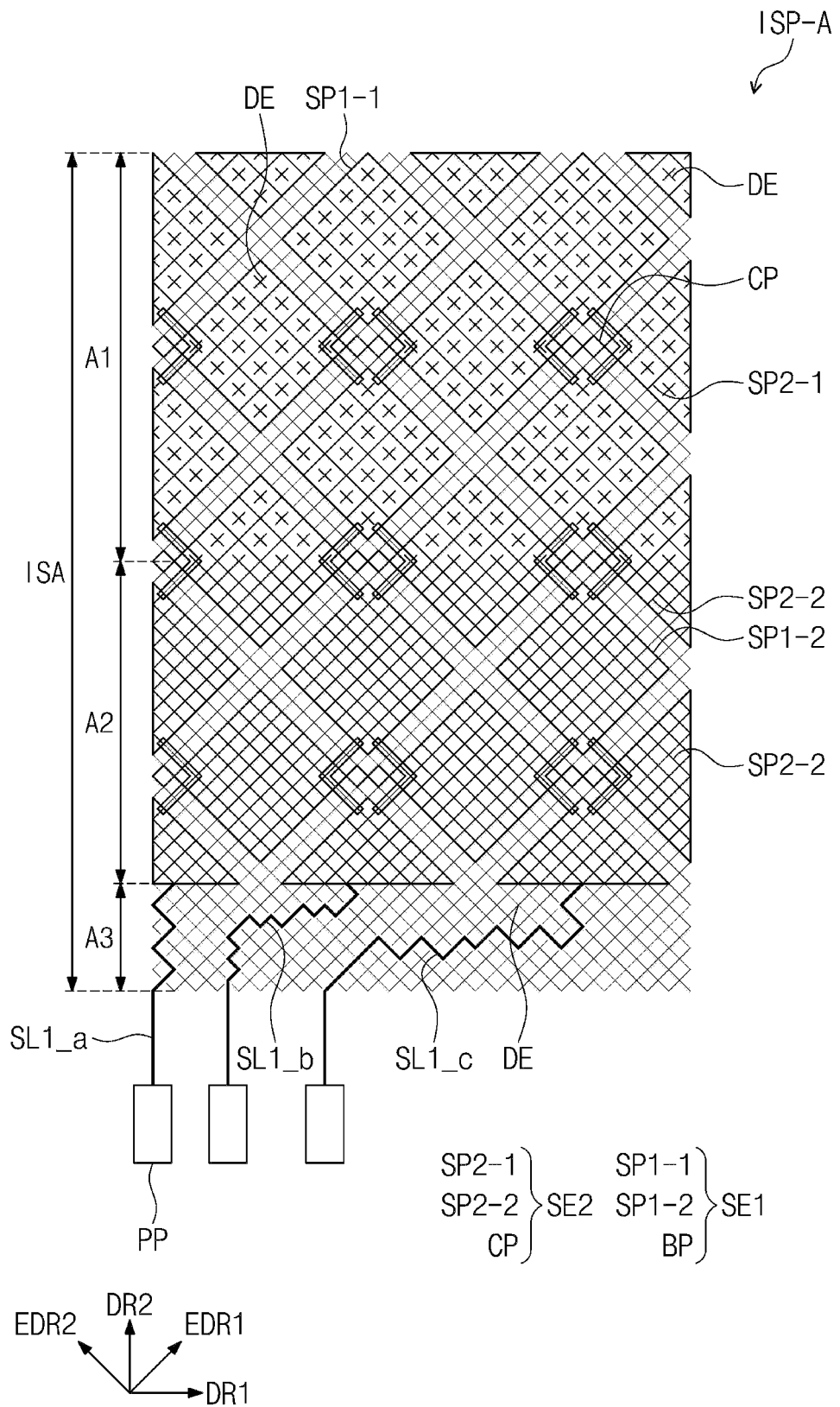
FIG. 12 is an enlarged plan view illustrating an input-sensing panel according to some embodiments of the inventive concept.

FIG. 10 is a plan view illustrating an input-sensing panel according to some embodiments of the inventive concept. FIG. 11A is an enlarged plan view illustrating a region TT' of FIG. 10. FIG. 11B is an enlarged plan view illustrating a region QQ' of FIG. 10. FIG. 12 is an enlarged plan view illustrating an input-sensing panel according to some embodiments of the inventive concept. In the following description, an element described with reference to FIGS. 1A to 9 will be identified by the same or similar reference number without repeating an overlapping description thereof.

Referring to FIG. 10, an input-sensing panel ISP-A according to some embodiments of the inventive concept may include the first sensing electrodes SE1, the second sensing electrodes SE2, the trace lines SL1 and SL2, and the sensing pads PP. The first sensing electrodes SE1 and the second sensing electrodes SE2 may be electrically disconnected from each other and may be provided to cross each other.

According to some embodiments, the sensing region ISA may include the first region A1, the second region A2, and the third region A3, which are sequentially arranged in the second direction DR2. The third region A3 may be spaced apart from the first region A1 with the second region A2 interposed therebetween.

According to some embodiments, each of the first sensing electrodes SE1 may have a bar or stripe shape and may be extended in the second direction DR2. The first sensing electrodes SE1 may be arranged to be spaced apart from each other in the first direction DR1.

Each of the second sensing electrodes SE2 may have a bar or stripe shape and may be extended in the first direction DR1. The second sensing electrodes SE2 may be arranged to be spaced apart from each other in the second direction DR2.

The input-sensing panel ISP-A may be operated in a first mode of obtaining information on the first input TC1 (e.g., see FIG. 3A) based on a variation in an electrostatic capacitance between the first and second sensing electrodes SE1 and SE2 or in a second mode of sensing the second input TC2 (e.g., see FIG. 3A) based on a variation in an electrostatic capacitance of each of the first and second sensing electrodes SE1 and SE2.

The input-sensing panel ISP-A may include a plurality of first trace lines SL1 and a plurality of second trace lines SL2. The second trace lines SL2 may be located in the non-sensing region NSA. The second trace lines SL2 may be electrically connected to opposite ends of the second sensing electrodes SE2.

For example, the second trace lines SL2 may include (2-1)-th trace lines S-L and (2-2)-th trace lines S-R. The (2-1)-th trace lines S-L may be connected to ends of the second sensing electrodes SE2, which are located in a left upper region, and the (2-2)-th trace lines S-R may be connected to opposite ends of the second sensing electrodes SE2, which are located in a right lower region. However, the connection structure of the second trace lines SL2 is not limited to this example or a specific example.

The first trace lines SL1 may be electrically connected to ends of the first sensing electrodes SE1. According to some embodiments of the inventive concept, at least one of the first trace lines SL1 may be located in the third region A3 of the sensing region ISA and the non-sensing region NSA (hereinafter, a fourth region).

That is, for the input-sensing panel ISP-A according to some embodiments of the inventive concept, at least one of the first trace lines SL1 connecting the first sensing electrodes SE1 to the sensing pads PP may be located in the third region A3 that is overlapped with the active region AA of the display panel DP (e.g., see FIG. 4).

Referring to FIG. 11A, each of the first sensing electrodes SE1 located in the first region A1 may include (1-1)-th patterns SP1-1, which are arranged in the second direction DR2, and bridge patterns BP, which are located between adjacent ones of the (1-1)-th patterns SP1-1.

Each of the second sensing electrodes SE2, which are located in the first region A1, may include (2-1)-th patterns SP2-1, which are arranged in the first direction DR1, and connection patterns CP, which are located between adjacent ones of the (2-1)-th patterns SP2-1.

The (1-1)-th patterns SP1-1, the (2-1)-th patterns SP2-1, and the connection patterns CP may be located on the same layer, and the bridge patterns BP may be located on a layer different from the patterns. For example, the (1-1)-th patterns SP1-1, the (2-1)-th patterns SP2-1, and the connection patterns CP may be directly located on the encapsulation substrate EC described with reference to FIG. 4, and the bridge patterns BP may be located on the first sensing insulating layer IIL1 described with reference to FIG. 4 and may be connected to corresponding ones of the (1-1)-th patterns SP1-1 through contact holes TNT defined in the first sensing insulating layer IIL1.

However, embodiments of the inventive concept are not limited to this example. For example, according to some embodiments, the (1-1)-th patterns SP1-1, the (2-1)-th patterns SP2-1, and the connection patterns CP may be located on the first sensing insulating layer IIL1, and the bridge patterns BP may be directly located on the encapsulation substrate EC.

The (1-1)-th patterns SP1-1, the (2-1)-th patterns SP2-1, and the connection patterns CP may include the first conductive lines LE1, which are extended in the first extension direction EDR1, and the second conductive lines LE2, which are extended in the second extension direction EDR2 crossing the first extension direction EDR1. The first and second conductive lines LE1 and LE2 may be arranged in the first and second directions DR1 and DR2 with a specific distance, and thus, the input-sensing panel ISP-A may have a mesh shape.

According to some embodiments, the dummy electrodes DE may be further located in the first and second conductive lines LE1 and LE2, which are included in the (1-1)-th and (2-1)-th patterns SP1-1 and SP2-1. The dummy electrode DE may include the first conductive lines LE1 (hereinafter, first dummy conductive lines), which are extended in the first extension direction EDR1, and the second conductive lines LE2 (hereinafter, second dummy conductive lines), which are extended in the second extension direction EDR2 crossing the first extension direction EDR1.

The dummy electrode DE may be electrically disconnected from the (1-1)-th and (2-1)-th patterns SP1-1 and SP2-1. Thus, the first and second conductive lines LE1 and LE2, which are included in the dummy electrode DE, may be disconnected from the first and second conductive lines LE1 and LE2, which are included in the (1-1)-th and (2-1)-th patterns SP1-1 and SP2-1. According to some embodiments, the dummy electrode DE may be located in each of the (1-1)-th and (2-1)-th patterns SP1-1 and SP2-1 as well as between the (1-1)-th and (2-1)-th patterns SP1-1 and SP2-1, which are adjacent to each other.

Referring to FIG. 11B, each of the first sensing electrodes SE1, which are located in the second region A2, may include (1-2)-th patterns SP1-2, which are arranged in the second direction DR2, and bridge patterns BP, which are located between adjacent ones of the (1-2)-th patterns SP1-2.

Each of the second sensing electrodes SE2, which are located in the second region A2, may include (2-2)-th patterns SP2-2, which are arranged in the first direction DR1, and connection patterns CP, which are located between adjacent ones of the (2-2)-th patterns SP2-2.

The (1-2)-th patterns SP1-2 and the (2-2)-th patterns SP2-2 may be located on the same layer as the (1-1)-th patterns SP1-1, the (2-1)-th patterns SP2-1, and the connection patterns CP. The (1-2)-th patterns SP1-2 may be directly located on the encapsulation substrate EC described with reference to FIG. 4, and the bridge patterns BP may be located on the first sensing insulating layer IIL1 described with reference to FIG. 4 and may be connected to corresponding ones of the (1-2)-th patterns SP1-2 through the contact holes TNT defined in the first sensing insulating layer IIL1.

The (1-2)-th patterns SP1-2, the (2-2)-th patterns SP2-2, and the connection patterns CP may include the first conductive lines LE1, which are extended in the first extension direction EDR1, and the second conductive lines LE2, which are extended in the second extension direction EDR2 crossing the first extension direction EDR1. The first and second conductive lines LE1 and LE2 may be arranged in the first and second directions DR1 and DR2 with a specific distance, and thus, the input-sensing panel ISP-A may have a mesh shape.

According to some embodiments, unlike the (1-1)-th and (2-1)-th patterns SP1-1 and SP2-1 located in the first region A1, the dummy electrode DE may not be located in the (1-2)-th and (2-2)-th patterns SP1-2 and SP2-2 located in the second region A2.

Thus, a density per unit area of the conductive lines LE1 and LE2 in the second region A2 may be higher than that in the first region A1. In the present specification, an expression "per unit area" may be defined based on an area of the region TT' or QQ' corresponding to one unit sensing region. In the present specification, the term "density" may be defined as an occupying area of the conductive lines LE1 and LE2 in the regions TT' and QQ' with the same area.

Because the density per unit area of the conductive lines LE1 and LE2 is high in the second region A2, the number of the conductive lines LE1 and LE2 located in the unit sensing region (e.g., the QQ' region) of the second region A2 may be greater than the number of the conductive lines LE1 and LE2 located in the unit sensing region (TT' region) of the first region A1.

According to some embodiments of the inventive concept, because the density per unit area of the conductive lines LE1 and LE2 is higher in the second region A2 than in the first region A1, the sensing sensitivity may be higher in the second region A2 than in the first region A1.

Referring to FIG. 12, first trace lines SL1_$a$, SL1_$b$, and SL1_$c$ may be connected to the first sensing electrodes SE1, to which different signals are provided. The first trace lines SL1_$a$, SL1_$b$, and SL1_$c$ may be located in the third region A3. The first trace lines SL1_$a$, SL1_$b$, and SL1_$c$ may be connected to corresponding ones of the sensing pads PP.

The dummy electrode DE may be located in the third region A3. The dummy conductive lines LE1 and LE2, which are included in the dummy electrode DE, may be disconnected from the first trace lines SL1_$a$, SL1_$b$, and SL1_$c$.

According to some embodiments of the inventive concept, because the conductive lines LE1 and LE2, which are used to sense the variation of the electrostatic capacitance and have a density per unit area higher in the second region A2 than in the first region A1, are located in the input-sensing panel ISP-A, the second region A2 may be used to compensate reduction of the sensing sensitivity in the third region A3, even when the third region A3 is located in the active region AA of the display panel DP (e.g., see FIG. 4). Accordingly, it may be possible to realize the input-sensing panel ISP-A with a reduced dead space DS and moreover to realize the electronic device ELD (e.g., see FIG. 1A) including the input-sensing panel ISP-A with uniform sensing sensitivity.

According to some embodiments of the inventive concept, it may be possible to realize an input-sensing panel, which has a relatively reduced dead space and relatively uniform sensing sensitivity, and a display device including the input-sensing panel.

While example embodiments of the inventive concept have been particularly shown and described, it will be understood by one of ordinary skill in the art that variations in form and detail may be made therein without departing from the spirit and scope of the attached claims, and their equivalents.

What is claimed is:
1. A display device, comprising:
a display panel including an active region and a peripheral region which are adjacent to each other; and
an input-sensing panel on the display panel, the input-sensing panel comprising a first region, a second region, and a third region, which are overlapped with the active region and are sequentially arranged, and a fourth region, which is overlapped with the peripheral region, wherein the input-sensing panel comprises:
a sensing electrode in the first and second regions and includes a plurality of conductive lines; and
a trace line in the third and fourth regions and connected to the sensing electrode,
wherein a density per unit area of the conductive lines is higher in the second region than in the first region.

2. The display device of claim 1, wherein the input-sensing panel further comprises a dummy electrode in the first, second, and third regions and is electrically disconnected from the sensing electrode and the trace line, and
the dummy electrode comprises a plurality of dummy conductive lines having a shape corresponding to the conductive lines.

3. The display device of claim 2, wherein a density per unit area of the dummy conductive lines is lower in the second region than in the first region.

4. The display device of claim 3, wherein the density per unit area of the dummy conductive lines is higher in the third region than in the first region.

5. The display device of claim 1, wherein an area of the second region is smaller than an area of the first region and is larger than an area of the third region.

6. The display device of claim 1, wherein the display panel comprises:
a base layer;
a circuit device layer including transistors on the base layer;
a display device layer on the circuit device layer, the display device layer comprising emission elements connected to a corresponding one of the transistors and includes a first electrode, a second electrode, and an emission layer between the first and second electrodes, and a pixel definition layer, in which display openings overlapped with the first electrodes are defined;
an encapsulation substrate spaced apart from the display device layer by a specific distance; and
a sealant extending along an edge of the base layer overlapped with the peripheral region and is between the encapsulation substrate and the base layer.

7. The display device of claim 6, wherein the conductive lines are directly on the encapsulation substrate.

8. The display device of claim 6, wherein the input-sensing panel comprises at least one sensing insulating layer covering the conductive lines.

9. The display device of claim 6, wherein the conductive lines are spaced apart from the display openings and are overlapped with the pixel definition layer in a plan view.

10. The display device of claim 8, wherein the encapsulation substrate comprises one of a plastic substrate, a glass substrate, a metal substrate, and a substrate made of an organic/inorganic composite material.

11. The display device of claim 8, wherein the sealant comprises one of organic adhesive materials and a frit.

12. The display device of claim 1, wherein the display panel comprises a display pad in the peripheral region,
the input-sensing panel comprises a sensing pad in the fourth region that is connected to the trace line, and
the display device further comprises a first flexible circuit film connected to the display pad, a second flexible circuit film connected to the sensing pad, and a main circuit board connected to the first and second flexible circuit films.

13. A display device, comprising:
a display panel including an active region having a plurality of pixels, and a peripheral region adjacent to the active region; and
an input-sensing panel comprising first, second, and third regions overlapped with the active region and a fourth region overlapped with the peripheral region, the first region including a plurality of first unit sensing regions, the second region including a plurality of second unit sensing regions, and the third region being spaced apart from the first region with the second region interposed therebetween,
wherein each of the first and second unit sensing regions comprises a first sensing electrode and a second sensing electrode, which are electrically disconnected from each other, and each of which includes a plurality of conductive lines, and
the number of the conductive lines in one of the first unit sensing regions is smaller than the number of the conductive lines in one of the second unit sensing regions.

14. The display device of claim 13, wherein the input-sensing panel comprises:
trace lines connected to corresponding ones of the first and second sensing electrodes; and
sensing pads connected to corresponding ones of the trace lines,
wherein ones of the trace lines, which are connected to the first sensing electrodes, are in the third and fourth regions, and
ones of the trace lines, which are connected to the second sensing electrodes, are in only the fourth region.

15. The display device of claim 14, wherein the input-sensing panel further comprises a dummy electrode, in the first, second, and third regions, which is electrically disconnected from the first and second sensing electrodes as well as from the trace line in the third region, and
the dummy electrode comprises a plurality of dummy conductive lines having a shape corresponding to the conductive lines.

16. The display device of claim 15, wherein the number of the dummy conductive lines in one of the first unit sensing regions is greater than the number of the dummy conductive lines in one of the second unit sensing regions.

17. The display device of claim 13, wherein an area of the second region is smaller than an area of the first region and is larger than an area of the third region.

18. The display device of claim 13, wherein the first sensing electrodes, which are included in adjacent ones of the first and second unit sensing regions, are connected to each other in a first direction, and
the second sensing electrodes, which are included in adjacent ones of the first and second unit sensing regions, are connected to each other in a second direction crossing the first direction.

19. The display device of claim 18, wherein the conductive lines comprise first conductive lines and second conductive lines,
each of the first conductive lines extends in a first extension direction that is diagonal to the first and second directions, and
each of the second conductive lines extends in a second extension direction that is diagonal to the first and second directions and is non-parallel to the first extension direction.

20. The display device of claim 19, wherein the active region comprises light-emitting regions, to which light rays generated by the pixels are provided, and a non-light-emitting region, which is adjacent to the light-emitting regions, and the first and second conductive lines are overlapped with the non-light-emitting region, but not with the light-emitting regions.

\* \* \* \* \*